US011075289B2

(12) United States Patent
Obu et al.

(10) Patent No.: US 11,075,289 B2
(45) Date of Patent: Jul. 27, 2021

(54) HETEROJUNCTION BIPOLAR TRANSISTOR INCLUDING BALLAST RESISTOR AND SEMICONDUCTOR DEVICE

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Takayuki Tsutsui, Nagaokakyo (JP); Satoshi Tanaka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/525,400

(22) Filed: Jul. 29, 2019

(65) Prior Publication Data

US 2020/0066886 A1 Feb. 27, 2020

(30) Foreign Application Priority Data

Aug. 24, 2018 (JP) .............................. JP2018-157609

(51) Int. Cl.
| | | |
|---|---|---|
| H01L 29/08 | (2006.01) | |
| H01L 29/73 | (2006.01) | |
| H01L 29/205 | (2006.01) | |
| H01L 29/417 | (2006.01) | |
| H01L 29/737 | (2006.01) | |
| H01L 21/8252 | (2006.01) | |
| H01L 21/285 | (2006.01) | |
| H01L 21/306 | (2006.01) | |
| H01L 21/308 | (2006.01) | |
| H01L 29/66 | (2006.01) | |
| H01L 27/082 | (2006.01) | |
| H03F 3/24 | (2006.01) | |
| H03F 1/56 | (2006.01) | |

(52) U.S. Cl.
CPC .... *H01L 29/7304* (2013.01); *H01L 21/28575* (2013.01); *H01L 21/308* (2013.01); *H01L 21/30617* (2013.01); *H01L 21/8252* (2013.01); *H01L 27/0823* (2013.01); *H01L 29/0817* (2013.01); *H01L 29/0826* (2013.01); *H01L 29/205* (2013.01); *H01L 29/41708* (2013.01); *H01L 29/66242* (2013.01); *H01L 29/7371* (2013.01); *H03F 1/56* (2013.01); *H03F 3/245* (2013.01); *H03F 2200/222* (2013.01); *H03F 2200/387* (2013.01); *H03F 2200/451* (2013.01)

(58) Field of Classification Search
CPC combination set(s) only.
See application file for complete search history.

(56) References Cited

U.S. PATENT DOCUMENTS

| | | |
|---|---|---|
| 5,378,922 A | 1/1995 | Sovero |
| 2015/0372098 A1* | 12/2015 | Zampardi ........... H01L 29/7371 257/198 |
| 2017/0236925 A1 | 8/2017 | Zampardi et al. |

FOREIGN PATENT DOCUMENTS

| | | |
|---|---|---|
| JP | 2000-260784 A | 9/2000 |
| JP | 2005-236259 A | 9/2005 |
| JP | 2010-183054 A | 8/2010 |

* cited by examiner

*Primary Examiner* — Daniel Whalen
(74) *Attorney, Agent, or Firm* — Studebaker & Brackett PC

(57) ABSTRACT

A first sub-collector layer functions as an inflow path of a collector current that flows in a collector layer of a heterojunction bipolar transistor. A collector ballast resistor layer having a lower doping concentration than the first sub-collector layer is disposed between the collector layer and the first sub-collector layer.

6 Claims, 32 Drawing Sheets

HETEROJUNCTION BIPOLAR TRANSISTOR INCLUDING BALLAST RESISTOR AND SEMICONDUCTOR DEVICE

CROSS-REFERENCE TO RELATED APPLICATION

This application claims benefit of priority to Japanese Patent Application No. 2018-157609, filed Aug. 24, 2018, the entire content of which is incorporated herein by reference.

BACKGROUND

Technical Field

The present disclosure relates to a heterojunction bipolar transistor and a semiconductor device.

Background Art

Mobile communication systems used in, for example, cellular phone terminals are to be transferred from the fourth generation (4G) to the fifth generation (5G). In the fifth-generation mobile communication systems, a frequency band (band) higher than that in the fourth-generation mobile communication systems is also used. With an increase in the frequency, the power loss in radio-frequency circuits increases. Therefore, for radio-frequency power amplifiers, which are main components of cellular phone terminals for the fifth-generation mobile communication systems, the demand for the realization of a higher output has been increasing.

In general, heterojunction bipolar transistors (HBTs) are used as transistors that form radio-frequency power amplifiers. One conceivable method for realizing a higher output of a radio-frequency power amplifier is a method for achieving a high-frequency operation by increasing the collector voltage of an HBT. However, the increase in the collector voltage increases the intensity of an electric field inside a semiconductor in a collector layer, resulting in an increase in the risk of breakage of an HBT due to avalanche multiplication. To prevent the breakage of an HBT, a protection circuit for preventing breakage, the protection circuit acting such that the collector voltage is not equal to or higher than a predetermined value, is provided, as described, for example, in Japanese Unexamined Patent Application Publication No. 2005-236259.

SUMMARY

The protection circuit disclosed in Japanese Unexamined Patent Application Publication No. 2005-236259 is formed by connecting a plurality of diodes in series. This protection circuit is connected between the emitter and the collector of an HBT in the forward bias direction. When a voltage equal to or higher than an on-state voltage of the diodes that are connected in multiple stages is applied between the collector and the emitter, the protection circuit turns to an ON-state, thereby preventing the HBT from being broken.

In order to use, as a protection circuit, a plurality of diodes that are connected in multiple stages, it is necessary to secure a region where the plurality of diodes are formed on a substrate besides a region where HBTs are formed. The method for forming a protection circuit by using diodes causes an increase in the chip size, and thus it is difficult to reduce the chip cost.

Accordingly, the present disclosure provides an HBT whose breakage due to avalanche multiplication can be suppressed without causing an increase in the chip size. It is another object of the present disclosure to provide a semiconductor device including the HBT.

According to an aspect of the present disclosure, there is provided a heterojunction bipolar transistor including a collector layer, a base layer, an emitter layer, a first sub-collector layer functioning as an inflow path of a collector current that flows in the collector layer, and a collector ballast resistor layer disposed between the collector layer and the first sub-collector layer and having a lower doping concentration than the first sub-collector layer.

According to another aspect of the present disclosure, there is provided a semiconductor device including, in sequence, a substrate, a first sub-collector layer, a collector ballast resistor layer having a lower doping concentration than the first sub-collector layer, a second sub-collector layer having a higher doping concentration than the collector ballast resistor layer, a collector layer, a base layer, and an emitter layer. In a first region within a plane of the substrate, the first sub-collector layer, the collector ballast resistor layer, the second sub-collector layer, the collector layer, the base layer, and the emitter layer form a first heterojunction bipolar transistor. A collector electrode of the first heterojunction bipolar transistor is connected to the first sub-collector layer. In a second region different from the first region, at least the second sub-collector layer, the collector layer, the base layer, and the emitter layer form a second heterojunction bipolar transistor. The semiconductor device further includes an interconnection line that connects the collector layer of the second heterojunction bipolar transistor to the emitter layer of the first heterojunction bipolar transistor.

When the collector current increases, the collector ballast resistor layer acts so as to decrease the collector voltage. As a result, a rapid increase in the collector current due to avalanche multiplication can be suppressed. Consequently, breakage of an HBT due to avalanche multiplication can be suppressed.

Other features, elements, characteristics and advantages of the present disclosure will become more apparent from the following detailed description of preferred embodiments of the present disclosure with reference to the attached drawings.

DETAILED DESCRIPTION

First Embodiment

An HBT according to a first embodiment will be described with reference to FIGS. 1 to 4B.

Figure 1:
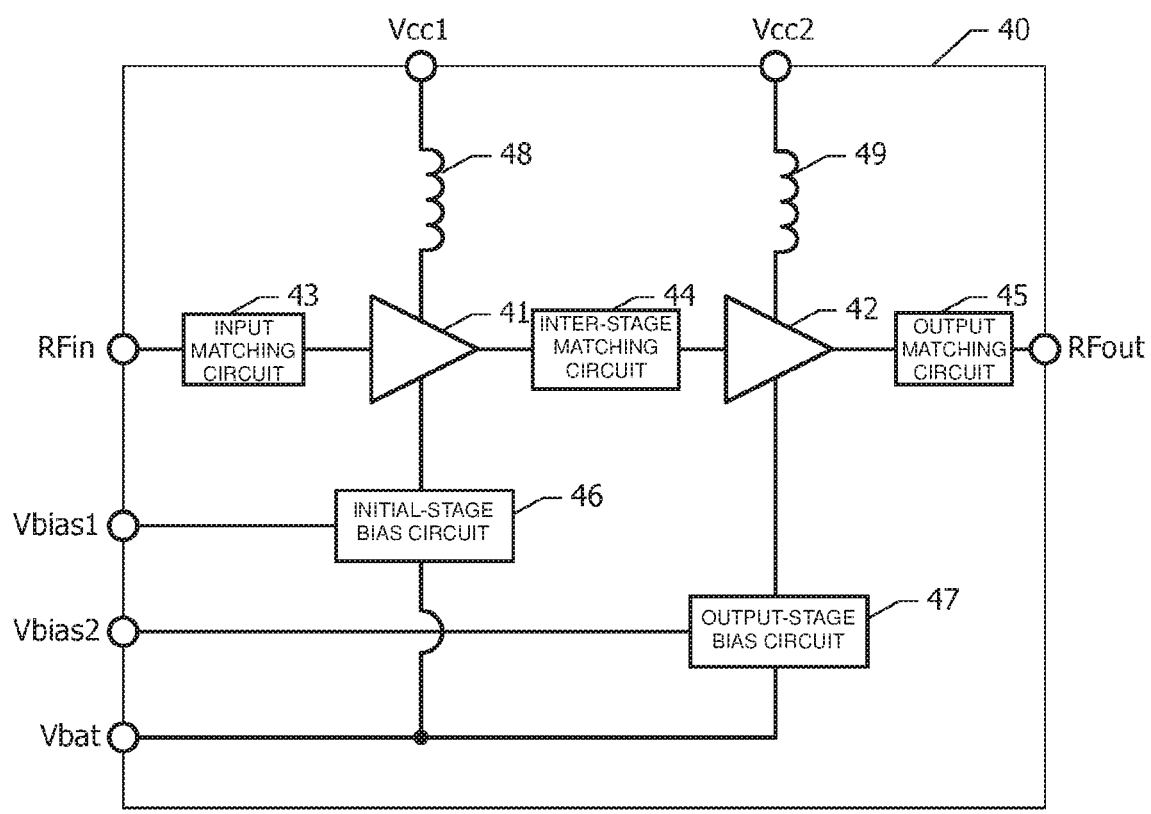
FIG. 1 is a block diagram of a radio-frequency power amplifier circuit including HBTs according to a first embodiment.

FIG. 1 is a block diagram of a radio-frequency power amplifier circuit 40 including HBTs according to the first embodiment. An input signal input from a radio-frequency signal input terminal $RF_{in}$ is input to an initial-stage amplifier circuit 41 through an input matching circuit 43. The signal amplified by the initial-stage amplifier circuit 41 is input to an output-stage amplifier circuit 42 through an inter-stage matching circuit 44. The signal amplified by the output-stage amplifier circuit 42 is output from a radio-frequency signal output terminal $RF_{out}$ through an output matching circuit 45.

A bias power supply voltage is supplied from a bias voltage input terminal $V_{bat}$ to an initial-stage bias circuit 46 and an output-stage bias circuit 47. The initial-stage bias circuit 46 supplies a bias voltage to an initial-stage amplifier circuit 41 on the basis of a bias control signal input from an initial-stage bias control terminal $V_{bias1}$. The output-stage bias circuit 47 supplies a bias voltage to an output-stage amplifier circuit 42 on the basis of a bias control signal input from an output-stage bias control terminal $V_{bias2}$. A power supply voltage is applied from an initial-stage amplifier circuit power supply voltage supply terminal $V_{cc1}$ to the initial-stage amplifier circuit 41 through an inductor 48. A power supply voltage is applied from an output-stage amplifier circuit power supply voltage supply terminal $V_{cc2}$ to the output-stage amplifier circuit 42 through an inductor 49.

Figure 2:
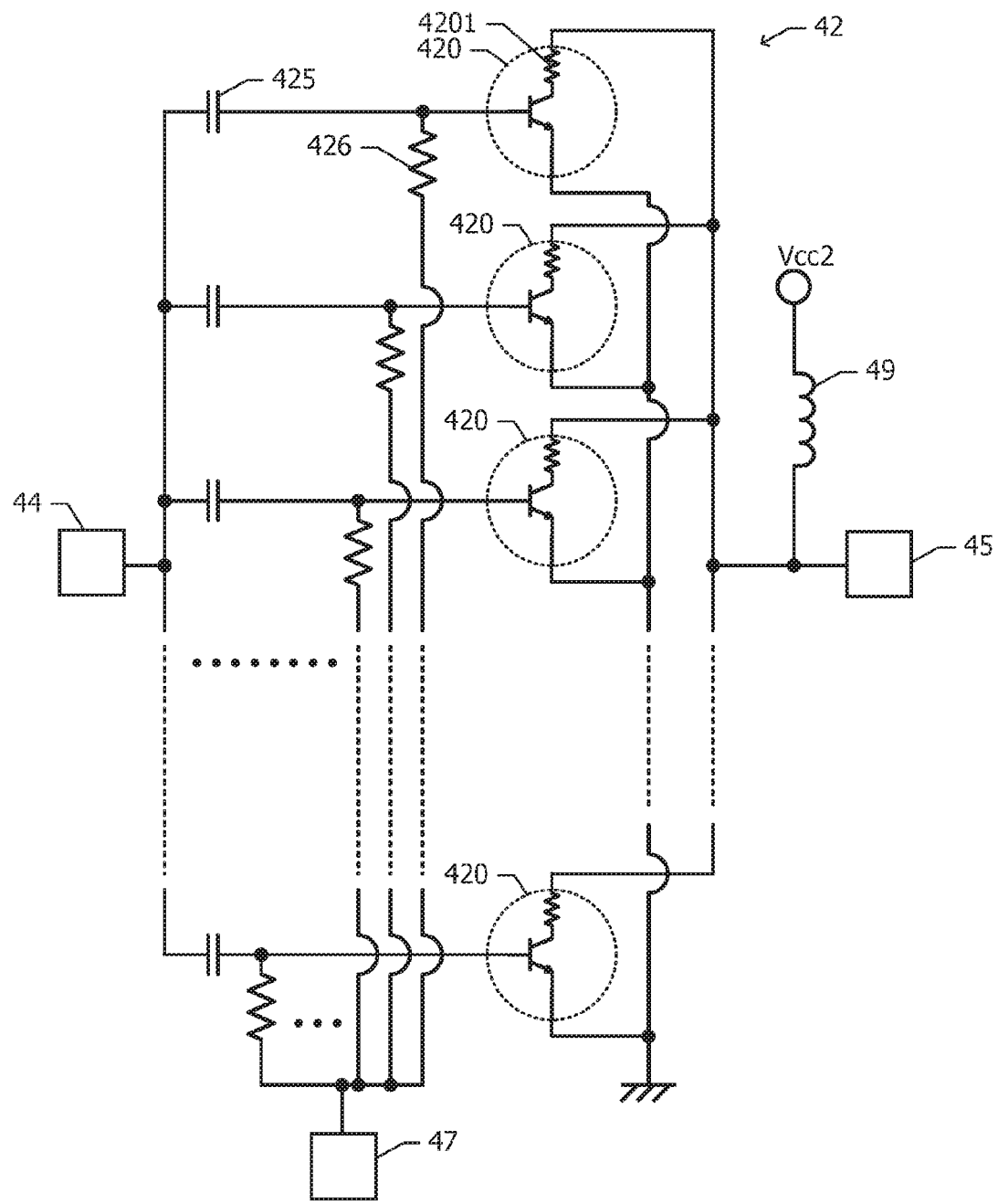
FIG. 2 is an equivalent circuit diagram of an output-stage amplifier circuit in the circuit shown in FIG. 1.

FIG. 2 is an equivalent circuit diagram of the output-stage amplifier circuit 42 (FIG. 1). The output-stage amplifier circuit 42 includes a plurality of HBTs 420 that are connected in parallel. Each of the HBTs 420 includes a collector ballast resistor 4201 connected to a collector. A DC cut capacitor 425 and a base ballast resistor 426 are connected to a base of each of the plurality of HBTs 420. The base ballast resistor 426 is inserted for the purpose of suppressing thermal runaway of the HBT 420. The radio-frequency signal output from the inter-stage matching circuit 44 is input to each of the bases of the HBTs 420 through the corresponding DC cut capacitor 425. A bias voltage is applied from the output-stage bias circuit 47 to each of the bases of the HBTs 420 through the corresponding base ballast resistor 426. An emitter of each of the HBTs 420 is grounded. The collector of each of the HBTs 420 is connected to the output matching circuit 45 with the collector ballast resistor 4201 therebetween and connected to the output-stage amplifier circuit power supply voltage supply terminal $V_{cc2}$ with the inductor 49 therebetween.

Figure 3:
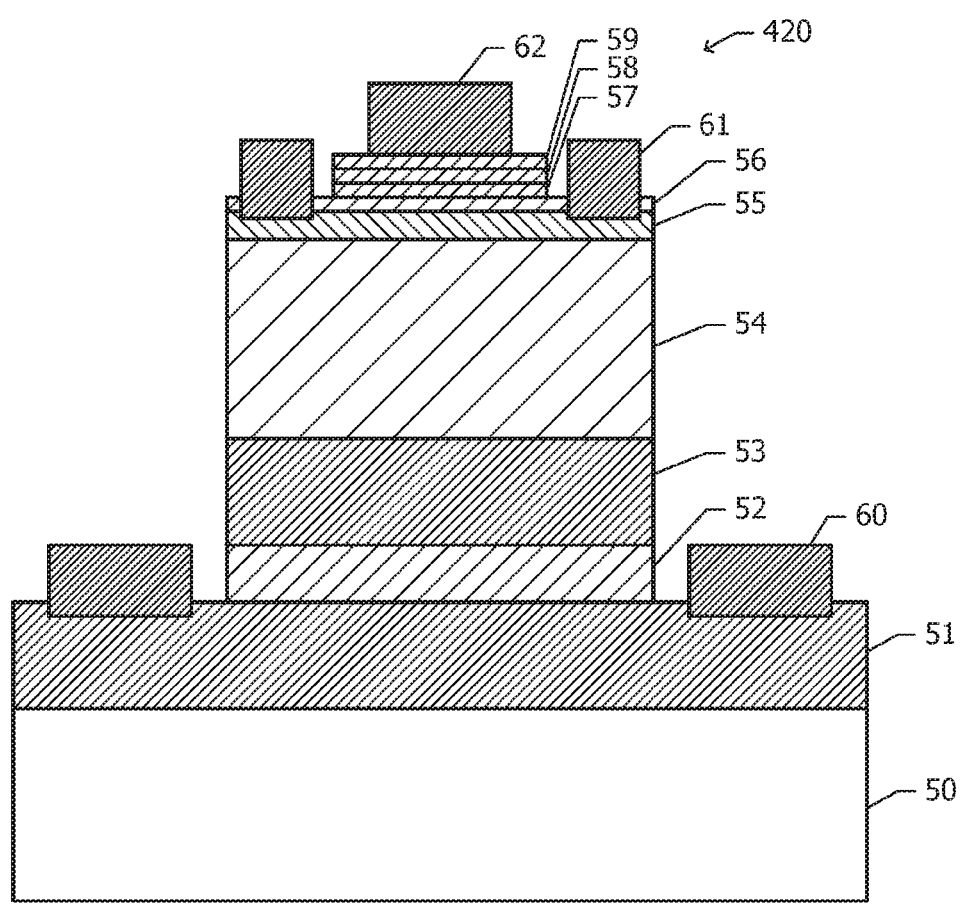
FIG. 3 is a sectional view of one HBT used in a radio-frequency power amplifier circuit according to the first embodiment.

FIG. 3 is a sectional view of one HBT 420. In FIG. 3, illustration of an interlayer insulating film, a passivation film, metal wiring lines, etc. is omitted.

A first sub-collector layer 51, a collector ballast resistor layer 52, a second sub-collector layer 53, a collector layer 54, a base layer 55, an emitter layer 56, a first contact layer 57, a second contact layer 58, and a third contact layer 59 are stacked on a substrate 50 made of semi-insulating GaAs and processed to have a desired shape. Specifically, semiconductor layers from the collector ballast resistor layer 52 to the emitter layer 56 are processed to have a mesa shape, and semiconductor layers from the first contact layer 57 to the third contact layer 59 are processed to have a smaller mesa shape. The electrical resistance of the collector ballast resistor layer 52 corresponds to the collector ballast resistor 4201 (FIG. 2).

An example of the composition, the doping concentration, and the thickness of each of the semiconductor layers will be described below. Each of the first sub-collector layer 51 and the second sub-collector layer 53 is formed of n-type GaAs having a Si doping concentration of $5\times10^{18}$ cm$^{-3}$ and has a thickness of 600 nm. The collector ballast resistor layer 52 is formed of n-type AlGaAs having a Si doping concentration of $1\times10^{17}$ cm$^{-3}$ and a molar ratio of AlAs of 0.33 and has a thickness of 200 nm.

The collector layer 54 is formed of n-type GaAs having a Si doping concentration of $1\times10^{16}$ cm$^{-3}$ and has a thickness of 1,000 nm. The base layer 55 is formed of p-type GaAs having a C doping concentration of $5\times10^{19}$ cm$^{-3}$ and has a thickness of 96 nm. The emitter layer 56 is formed of n-type InGaP having a Si doping concentration of $4\times10^{17}$ cm$^{-3}$ and a molar ratio of InP of 0.48 and has a thickness of 35 nm.

The first contact layer 57 is formed of n-type GaAs having a Si doping concentration of $5\times10^{18}$ cm$^{-3}$ and has a thickness of 50 nm. The second contact layer 58 is formed of n-type InGaAs which has a Si doping concentration of $5\times10^{18}$ cm$^{-3}$ and in which a molar ratio of InAs is changed from 0 to 0.5 in a direction from the first contact layer 57 toward the third contact layer 59 and has a thickness of 50 nm. The third contact layer 59 is formed of n-type InGaAs having a Si doping concentration of $1\times10^{19}$ cm$^{-3}$ and a molar ratio of InAs of 0.5 and has a thickness of 50 nm.

A collector electrode 60 is formed on the first sub-collector layer 51. The collector electrode 60 has a multilayer metal structure in which a AuGe layer having a thickness of 60 nm, a Ni layer having a thickness of 10 nm, and a Au layer having a thickness of 200 nm are sequentially stacked. The lowest AuGe layer is in contact with a partial region of the surface of the first sub-collector layer 51 to establish electrical connection between the collector electrode 60 and the first sub-collector layer 51. The first sub-collector layer 51 has a function as an inflow path of a current that flows in the collector layer 54.

A base electrode 61 is formed on the emitter layer 56, extends through the emitter layer 56, and is electrically connected to the base layer 55. The base electrode 61 has a multilayer metal structure in which a Pt layer having a thickness of 20 nm, a Ti layer having a thickness of 50 nm, a Pt layer having a thickness of 50 nm, and a Au layer having a thickness of 200 nm are sequentially stacked. The lowest Pt layer extends through the emitter layer 56 and reaches the base layer 55.

An emitter electrode 62 is formed on the third contact layer 59. The emitter electrode 62 has a multilayer metal structure in which a Mo layer having a thickness of 10 nm, a Ti layer having a thickness of 5 nm, a Pt layer having a thickness of 30 nm, and a Au layer having a thickness of 200 nm are sequentially stacked. The lowest Mo layer is in contact with a partial region of the upper surface of the third contact layer 59. The emitter electrode 62 is electrically connected to the emitter layer 56 with the second contact layer 58 and the first contact layer 57 therebetween.

Next, the function of the collector ballast resistor 4201 (FIG. 2) will be described with reference to FIGS. 4A and 4B.

Figure 4A:
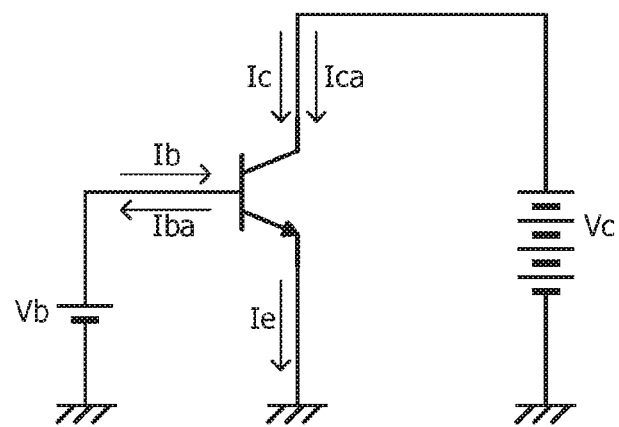
FIG. 4A is an equivalent circuit diagram for explaining an operation of an HBT including no collector ballast resistor.

FIG. 4A is an equivalent circuit diagram for explaining an operation of an HBT including no collector ballast resistor 4201 (FIG. 2). The sectional structure of this HBT is, for example, the same as the structure obtained by removing the collector ballast resistor layer 52 from the sectional structure illustrated in FIG. 3. A collector bias voltage $V_c$ is applied to a collector of the HBT, and a base bias voltage $V_b$ is applied to a base of the HBT. With an increase in the collector bias voltage $V_c$, the intensity of the electric field in the collector layer 54 (FIG. 3) increases. When the intensity of the electric field in the collector layer 54 becomes higher than an intensity of the electric field at which avalanche multiplication occurs, in addition to a collector current $I_c$ in normal operation, an avalanche current $I_{ca}$ due to the avalanche multiplication flows.

Among electron-hole pairs generated in the depletion region of the collector layer 54 by avalanche multiplication, electrons move towards the second sub-collector layer 53 (FIG. 3), and holes move toward the base layer 55 (FIG. 3). Most of the holes reaching the base layer 55 flow into the base electrode 61. As a result, a base current $I_{ba}$ having a magnitude substantially the same as the avalanche current $I_{ca}$ flows out from the base in a direction opposite to a direction of a base current $I_b$ in normal operation. An emitter current $I_e$ hardly changes even if avalanche multiplication occurs.

Figure 4B:
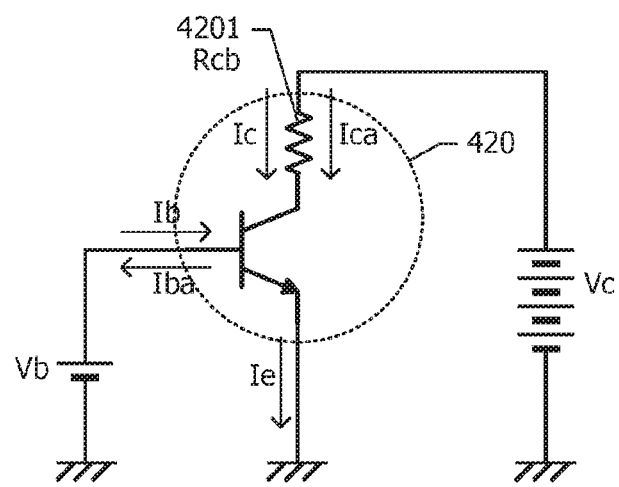
FIG. 4B is an equivalent circuit diagram for explaining an operation for avalanche multiplication of one HBT according to the first embodiment.

FIG. 4B is an equivalent circuit diagram for explaining an operation for avalanche multiplication of one HBT 420 according to the first embodiment. A collector ballast resistor 4201 is connected to a collector of the HBT 420. The resistance of the collector ballast resistor 4201 is represented by $R_{cb}$. When an avalanche current $I_{ca}$ flows in the collector of the HBT 420, the voltage applied to the collector is decreased by the voltage drop caused by the collector ballast resistor 4201, that is, $I_{ca} \times R_{cb}$, compared with the case where only a collector current $I_c$ in normal operation flows. The decrease in the voltage applied to the collector weakens the intensity of the electric field in the collector layer 54 to suppress the occurrence of avalanche multiplication. Thus, the collector ballast resistor 4201 is an element having a negative feedback effect with respect to the avalanche current $I_{ca}$.

Next, advantageous effects of the first embodiment will be described.

In the first embodiment, since the collector ballast resistor 4201 has a negative feedback effect with respect to the avalanche current $I_{ca}$, the occurrence of avalanche multiplication can be suppressed. Furthermore, in the first embodiment, the collector ballast resistor layer 52 (FIG. 3) acting as the collector ballast resistor 4201 is incorporated in the HBT 420, and the collector ballast resistor layer 52 is disposed inside the HBT 420 in plan view. Therefore, even when the collector ballast resistor 4201, which is an element for suppressing the occurrence of avalanche multiplication, is arranged, the chip size is not increased. Since the occurrence of avalanche multiplication is suppressed, a high output of the output-stage amplifier circuit 42 can be realized by increasing the collector voltage.

Next, various modifications of the first embodiment will be described.

In the first embodiment, the first sub-collector layer 51 and the second sub-collector layer 53 each have a doping concentration of $5\times10^{18}$ cm$^{-3}$. The first sub-collector layer 51 may have such a doping concentration that the first sub-collector layer 51 functions as a low-resistance current path of the collector current. For example, the first sub-collector layer 51 preferably has a doping concentration of $1\times10^{18}$ cm$^{-3}$ or more. The doping concentration of the first sub-collector layer 51 is not necessarily the same as the doping concentration of the second sub-collector layer 53.

In the first embodiment, the second sub-collector layer 53 is disposed between the collector ballast resistor layer 52 and the collector layer 54. Alternatively, the second sub-collector layer 53 may be omitted, and the collector layer 54 may be formed directly on the collector ballast resistor layer 52. In this case, the collector ballast resistor layer 52 similarly functions as the collector ballast resistor 4201 (FIG. 2). Note that in the case where the HBT 420 is operated under such a condition that the extension of the depletion region extending on both sides of the p-n junction interface between the base layer 55 and the collector layer 54 enters the collector ballast resistor layer 52, the second sub-collector layer 53 is preferably disposed so as to suppress the extension of the depletion region. The second sub-collector layer 53 preferably has a doping concentration of $1\times10^{18}$ cm$^{-3}$ or more in order to obtain a sufficient effect of suppressing the extension of the depletion region.

In the first embodiment, the collector ballast resistor layer 52 has a doping concentration of $1\times10^{17}$ cm$^{-3}$. Alternatively, the collector ballast resistor layer 52 may have another doping concentration at which the collector ballast resistor layer 52 substantially functions as the collector ballast resistor 4201. For example, the doping concentration of the collector ballast resistor layer 52 is preferably lower than each of the doping concentration of the first sub-collector layer 51 and the doping concentration of the second sub-collector layer 53. For example, the collector ballast resistor layer 52 preferably has a doping concentration of less than $1\times10^{18}$ cm$^{-3}$ and more preferably $5\times10^{17}$ cm$^{-3}$ or less.

When the thickness of the collector ballast resistor layer 52 is reduced to the extent that a tunneling phenomenon occurs, the collector ballast resistor layer 52 does not function as the collector ballast resistor 4201. Accordingly, the thickness of the collector ballast resistor layer 52 is preferably increased to the extent that a tunneling phenomenon does not occur. For example, the thickness of the collector ballast resistor layer 52 is preferably 30 nm or more.

In the first embodiment, the collector ballast resistor layer 52 is formed of AlGaAs and the molar ratio of AlAs is 0.33. The molar ratio of AlAs of the collector ballast resistor layer 52 is preferably 0.43 or less. The molar ratio of AlAs of the collector ballast resistor layer 52 may be 0. The collector ballast resistor layer 52 is preferably formed of a compound semiconductor containing AlGaAs or GaAs as a main component. AlGaAs has a property that an increase in the resistivity with an increase in the temperature is sharper than that in GaAs. An increase in the resistance $R_{cb}$ of the collector ballast resistor 4201 (FIG. 4B) enhances the negative feedback effect with respect to the avalanche current $I_{ca}$ (FIG. 4B). Accordingly, in the case where a larger negative feedback effect is desired, the collector ballast resistor layer 52 is preferably formed of AlGaAs.

In the first embodiment, the output-stage amplifier circuit 42 has been described with reference to FIG. 2. The initial-stage amplifier circuit 41 also preferably has the same circuit configuration as the equivalent circuit diagram illustrated in FIG. 2. In this case, the occurrence of avalanche multiplication can be also suppressed in the initial-stage amplifier circuit 41.

In the first embodiment, the substrate 50, the collector layer 54, and the base layer 55 are formed by using GaAs, and the emitter layer 56 is formed by using InGaP. Alternatively, the heterojunction bipolar transistor may be formed by using other compound semiconductor materials.

Second Embodiment

Next, an HBT according to a second embodiment will be described with reference to FIGS. 5 to 7B. Hereafter, descriptions of configurations that are common to those of the HBT according to the first embodiment will be omitted.

Figure 5:
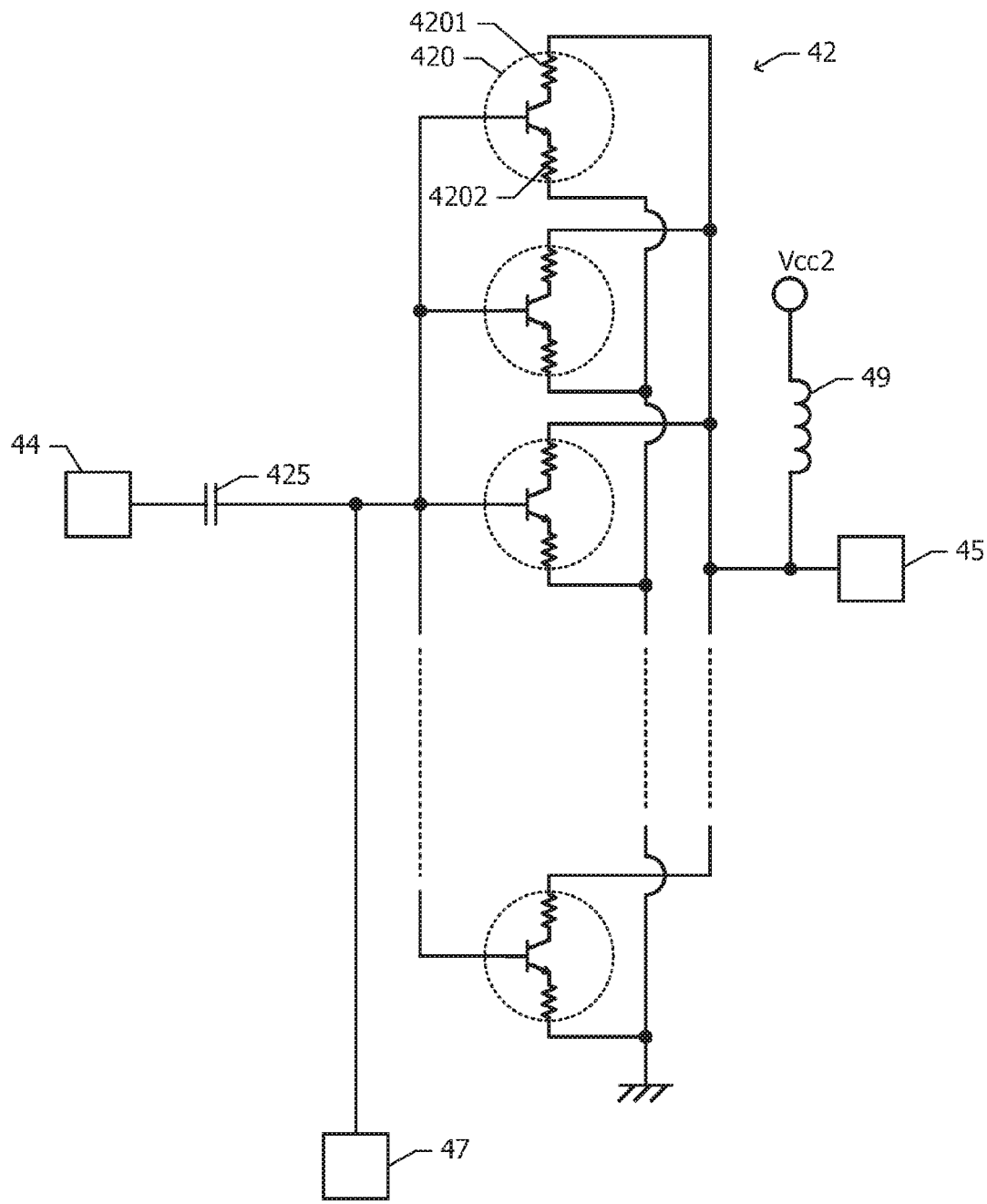
FIG. 5 is an equivalent circuit diagram of an output-stage amplifier circuit in the circuit shown in FIG. 1 including HBTs according to a second embodiment.

FIG. 5 is an equivalent circuit diagram of an output-stage amplifier circuit 42 (FIG. 1) including HBTs according to the second embodiment. In the first embodiment, the base ballast resistors 426 (FIG. 2) are provided so as to correspond to the HBTs 420. However, in the second embodiment, no base ballast resistors are provided. Since no base ballast resistors are provided, bases of a plurality of HBTs 420 are short-circuited with each other. A single DC cut capacitor 425 is connected to the plurality of HBTs 420.

In the second embodiment, an emitter ballast resistor 4202 is incorporated in each of the HBTs 420 instead of the base ballast resistor. An emitter of each of the HBTs 420 is grounded via the emitter ballast resistor 4202. Specifically, each of the HBTs 420 includes a collector ballast resistor 4201 and the emitter ballast resistor 4202. A bias voltage is applied from an output-stage bias circuit 47 to each of the bases of the HBTs 420 with no base ballast resistor interposed therebetween.

Figure 6:
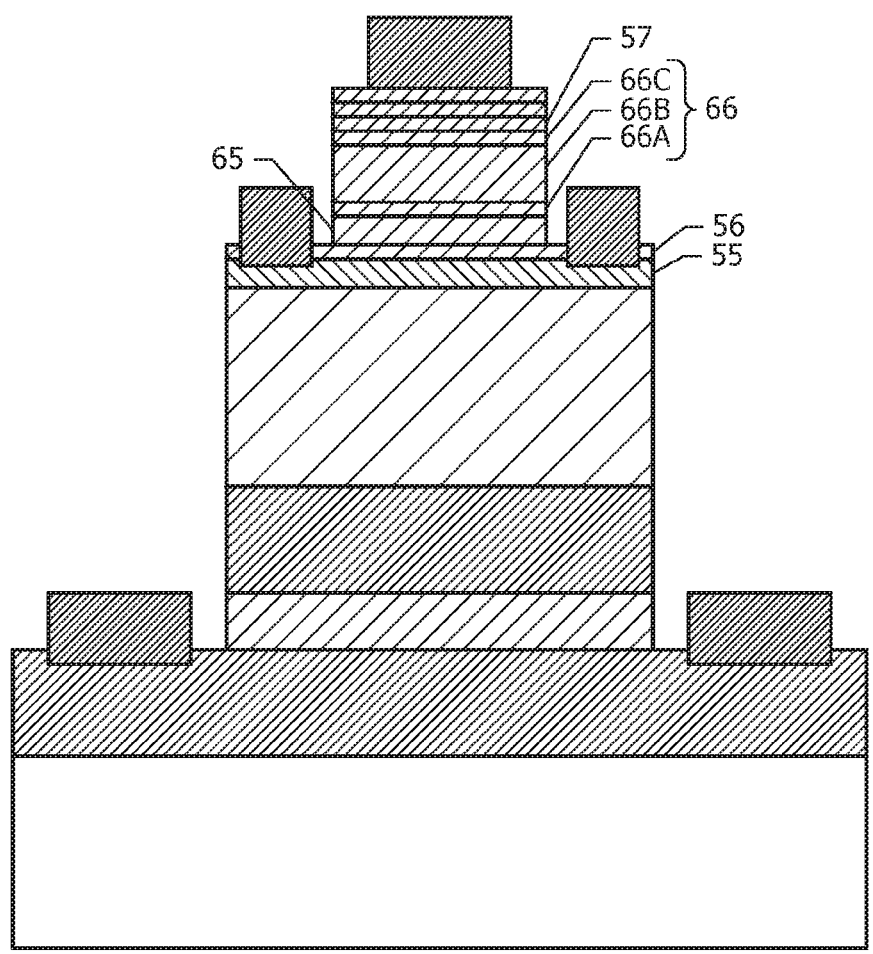
FIG. 6 is a sectional view of an HBT according to the second embodiment.

FIG. 6 is a sectional view of an HBT 420 according to the second embodiment. In the first embodiment, the first contact layer 57 is formed directly on the emitter layer 56 (FIG. 3). In the second embodiment, an emitter ballast resistor layer 66 is disposed on the side opposite to a base layer 55, as viewed from an emitter layer 56 (between an emitter layer 56 and a first contact layer 57). Furthermore, a spacer layer 65 is disposed between the emitter ballast resistor layer 66 and the emitter layer 56. Other sectional structures of the HBT 420 according to the second embodiment are the same as the sectional structures (FIG. 3) of the HBT 420 according to the first embodiment.

The emitter ballast resistor layer 66 has a multilayer structure in which a first emitter ballast resistor layer 66A, a second emitter ballast resistor layer 66B, and a third emitter ballast resistor layer 66C are sequentially stacked from the emitter layer 56 side toward the first contact layer 57 side (upward). The first emitter ballast resistor layer 66A, the second emitter ballast resistor layer 66B, and the third emitter ballast resistor layer 66C are formed of n-type AlGaAs having a Si doping concentration of $1\times10^{17}$ cm$^{-3}$. The molar ratio of AlAs of the first emitter ballast resistor layer 66A changes upward from 0 to 0.33. The molar ratio of AlAs of the second emitter ballast resistor layer 66B is constant at 0.33. The molar ratio of AlAs of the third emitter ballast resistor layer 66C changes upward from 0.33 to 0. The thicknesses of the first emitter ballast resistor layer 66A, the second emitter ballast resistor layer 66B, and the third emitter ballast resistor layer 66C are 50 nm, 200 nm, and 50 nm, respectively.

The spacer layer 65 is formed of n-type GaAs having a Si doping concentration of $3\times10^{17}$ cm$^{-3}$ and has a thickness of 100 nm.

The first emitter ballast resistor layer 66A having a composition gradient in the thickness direction has a function of preventing a spike and a notch from generating in the conduction band and the valence band at the junction interface between the emitter ballast resistor layer 66 and the spacer layer 65. Similarly, the third emitter ballast resistor layer 66C has a function of preventing a spike and a notch from generating in the conduction band and the valence band at the junction interface between the emitter ballast resistor layer 66 and the first contact layer 57. The spacer layer 65 has a function of preventing a decrease in reliability due to a direct contact between the emitter layer 56 and the emitter ballast resistor layer 66.

Next, advantageous effects of the second embodiment will be described with reference to FIGS. 7A and 7B.

Figure 7A:
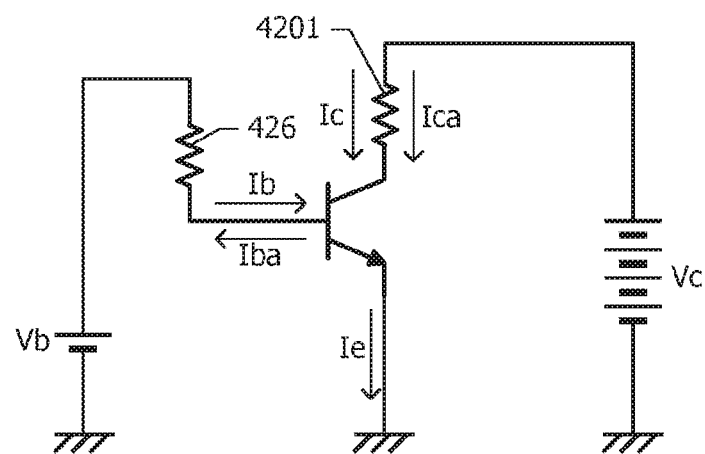
FIG. 7A is an equivalent circuit diagram for explaining an operation of an HBT circuit including a base ballast resistor and a collector ballast resistor.

FIG. 7A is an equivalent circuit diagram for explaining an operation of an HBT circuit including a base ballast resistor 426 and a collector ballast resistor 4201. A base bias voltage $V_b$ is applied to a base of an HBT through a base ballast resistor 426. A collector bias voltage $V_c$ is applied to a collector of the HBT through a collector ballast resistor 4201.

FIG. 7A illustrates a state in which an avalanche current $I_{ca}$ flows in the collector of the HBT while being superimposed on a collector current $I_c$ in normal operation. A base current $I_{ba}$ due to the avalanche current $I_{ca}$ flows in the base of the HBT in a direction opposite to a direction of a base current $I_b$ in normal operation. Therefore, when the base current $I_{ba}$ flows, the base voltage is increased by the voltage drop caused by the base ballast resistor 426 due to the base current $I_{ba}$ compared with the case of normal operation. The increase in the base voltage acts so as to increase the collector current. Accordingly, the base ballast resistor 426 may reduce the effect of suppressing the avalanche current $I_{ca}$, the effect being achieved by the collector ballast resistor 4201.

Figure 7B:
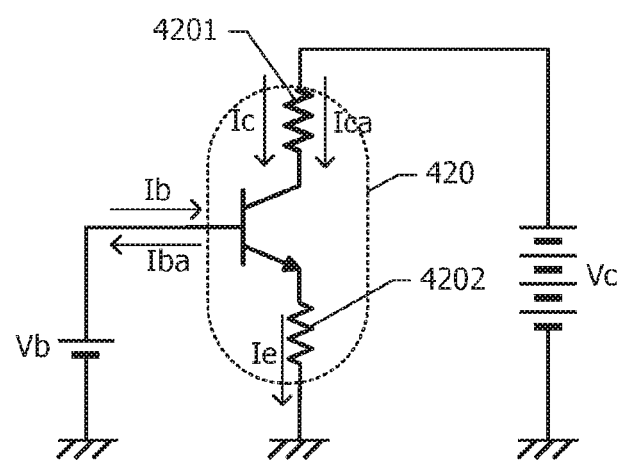
FIG. 7B is an equivalent circuit diagram for explaining an operation for avalanche multiplication of an HBT according to the second embodiment.

FIG. 7B is an equivalent circuit diagram for explaining an operation for avalanche multiplication of an HBT 420 according to the second embodiment. A base ballast resistor for suppressing thermal runaway of the HBT 420 is not inserted, and an emitter ballast resistor 4202 is inserted instead. Even when a base current $I_{ba}$ flows due to the occurrence of avalanche multiplication, the base voltage does not substantially change. In addition, even when an avalanche current $I_{ca}$ flows, most of the current flows out from the base, and thus an emitter current $I_e$ does not substantially increase. Accordingly, even when the emitter ballast resistor 4202 is inserted, the emitter voltage does not substantially change. Therefore, the emitter ballast resistor 4202 does not reduce the effect of suppressing the occurrence of avalanche multiplication, the effect being achieved by the collector ballast resistor 4201. In the second embodiment, a reduction in the effect achieved by inserting the collector ballast resistor 4201 can be suppressed as described above.

Third Embodiment

Next, an HBT according to a third embodiment will be described with reference to FIG. 8. Hereafter, descriptions of configurations that are common to those of the HBT according to the first embodiment (FIG. 3) will be omitted.

Figure 8:
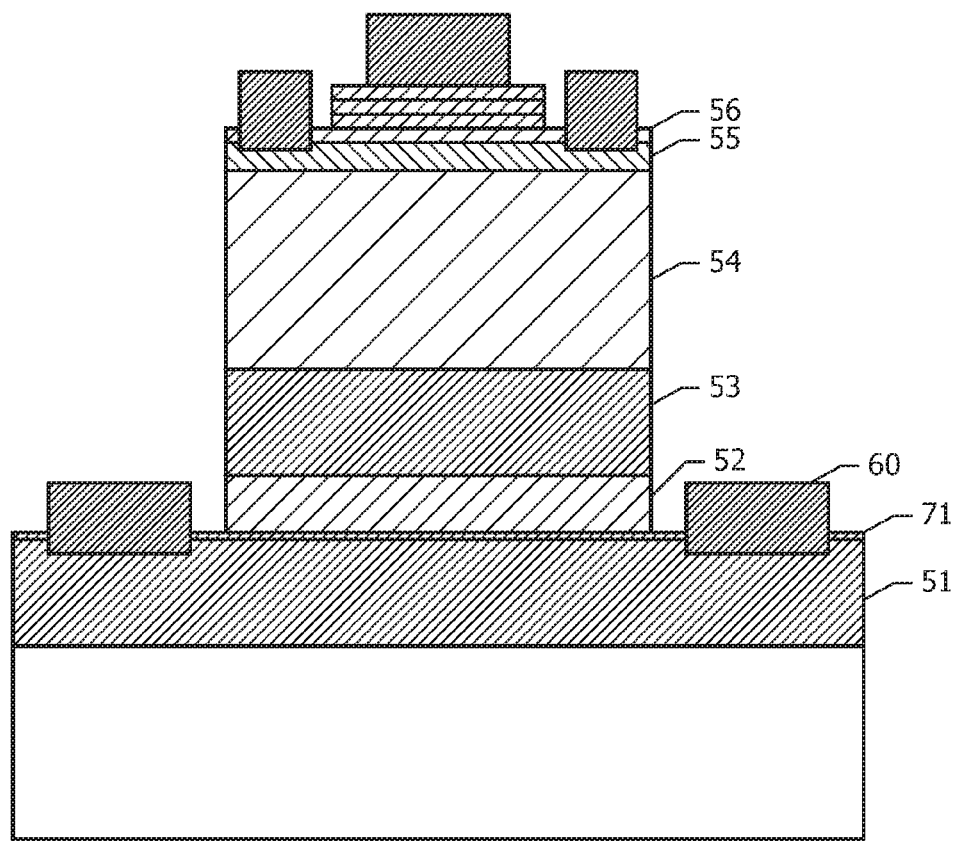
FIG. 8 is a sectional view of an HBT according to a third embodiment.

FIG. 8 is a sectional view of an HBT according to the third embodiment. In the first embodiment (FIG. 3), the collector ballast resistor layer 52 is formed directly on the first sub-collector layer 51. In the third embodiment, a first etching stopper layer 71 is disposed between a first sub-collector layer 51 and a collector ballast resistor layer 52. A semiconductor material used as the first etching stopper layer 71 is selected such that the collector ballast resistor layer 52 can be selectively etched with respect to the first etching stopper layer 71. For example, a semiconductor material containing As as a group V element is used as the collector ballast resistor layer 52, and a semiconductor material containing P as a group V element is used as the first etching stopper layer 71.

For example, the first etching stopper layer 71 is formed of n-type InGaP having a Si doping concentration of $5 \times 10^{18}$ cm$^{-3}$ and a molar ratio of InP of 0.48 and has a thickness of 5 nm. The first etching stopper layer 71 is disposed to extend to an outer side portion of the collector ballast resistor layer 52 in plan view. The first etching stopper layer 71 is removed in a region where a collector electrode 60 is disposed.

Next, advantageous effects of the third embodiment will be described. In the third embodiment, in an etching process for forming a mesa shape that includes semiconductor layers from the collector ballast resistor layer 52 to an emitter layer 56, etching can be stopped on the upper surface of the first etching stopper layer 71 with good repeatability. Therefore, the third embodiment achieves, in addition to the advantageous effects of the first embodiment, an advantageous effect of improving the production yield compared with the case where etching is stopped by time control.

The thickness of the first etching stopper layer 71 is preferably reduced to the extent that the flow of the collector current between the collector ballast resistor layer 52 and the first sub-collector layer 51 is not disturbed. For example, the first etching stopper layer 71 preferably has such a thickness that a tunneling phenomenon occurs between the collector ballast resistor layer 52 and the first sub-collector layer 51. For example, the thickness of the first etching stopper layer 71 is preferably 30 nm or less. On the other hand, when the first etching stopper layer 71 has an excessively small thickness, repeatability of the etching stop decreases. In order to stop etching with high repeatability using the first etching stopper layer 71, the thickness of the first etching stopper layer 71 is preferably 5 nm or more.

Fourth Embodiment

Next, an HBT according to a fourth embodiment will be described with reference to FIG. 9. Hereafter, descriptions of configurations that are common to those of the HBT according to the first embodiment (FIG. 3) will be omitted.

Figure 9:
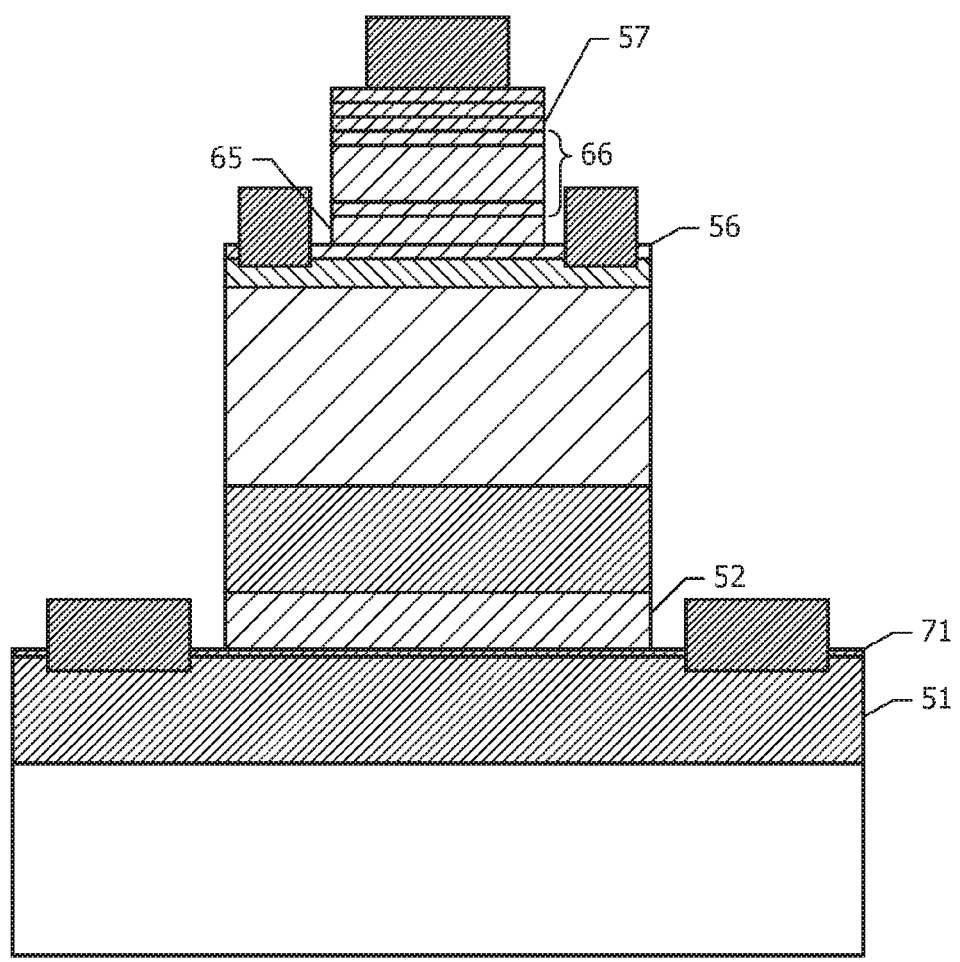
FIG. 9 is a sectional view of an HBT according to a fourth embodiment.

FIG. 9 is a sectional view of an HBT according to the fourth embodiment. In the fourth embodiment, a first etching stopper layer 71 is disposed between a first sub-collector layer 51 and a collector ballast resistor layer 52 as in the third embodiment (FIG. 8). Furthermore, a spacer layer 65 and an emitter ballast resistor layer 66 are disposed between an emitter layer 56 and a first contact layer 57 as in the second embodiment (FIG. 6).

In the fourth embodiment, the advantageous effect of suppressing the occurrence of avalanche multiplication is obtained as in the second embodiment, and the advantageous effect of improving the production yield is obtained as in the third embodiment.

Fifth Embodiment

Next, a radio-frequency power amplifier circuit according to a fifth embodiment will be described with reference to FIGS. 10 to 12. Hereafter, descriptions of configurations that are common to those of the radio-frequency power amplifier circuit including the HBT according to the first embodiment (FIGS. 1, 2, and 3) will be omitted.

Figure 10:
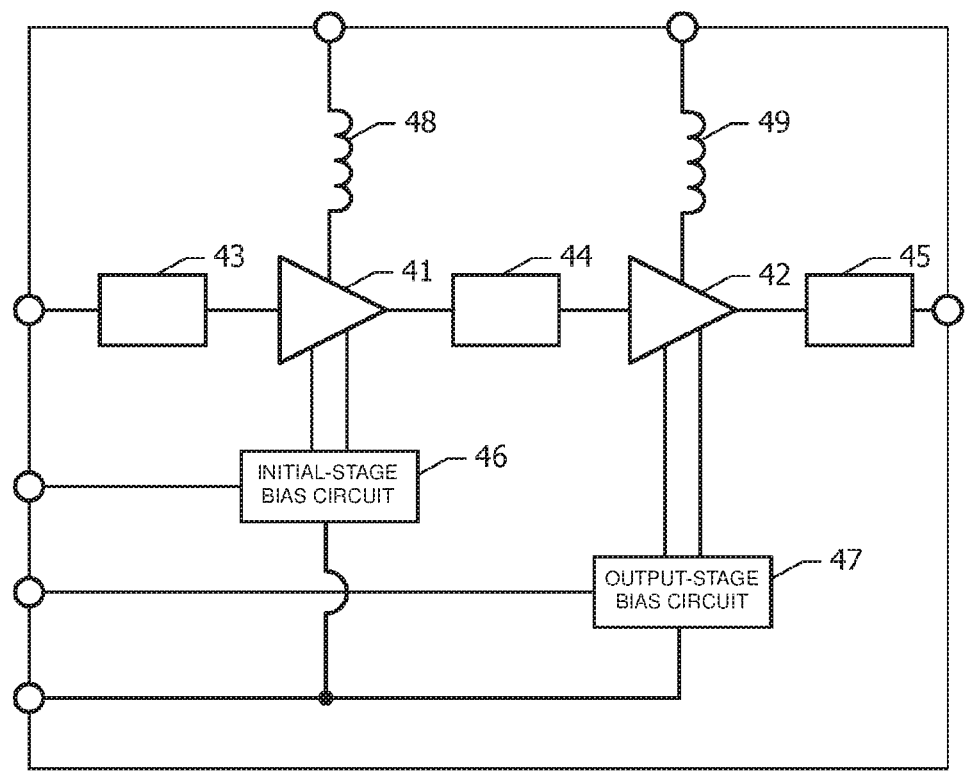
FIG. 10 is a block diagram of a radio-frequency power amplifier circuit according to a fifth embodiment.

FIG. 10 is a block diagram of a radio-frequency power amplifier circuit according to the fifth embodiment. In the first embodiment (FIG. 1), the bias supply from the initial-stage bias circuit 46 to the initial-stage amplifier circuit 41 and the bias supply from the output-stage bias circuit 47 to the output-stage amplifier circuit 42 are each performed through one system. In the fifth embodiment, the bias supply from an initial-stage bias circuit 46 to an initial-stage amplifier circuit 41 and the bias supply from an output-stage bias circuit 47 to an output-stage amplifier circuit 42 are each performed through two systems.

Figure 11:
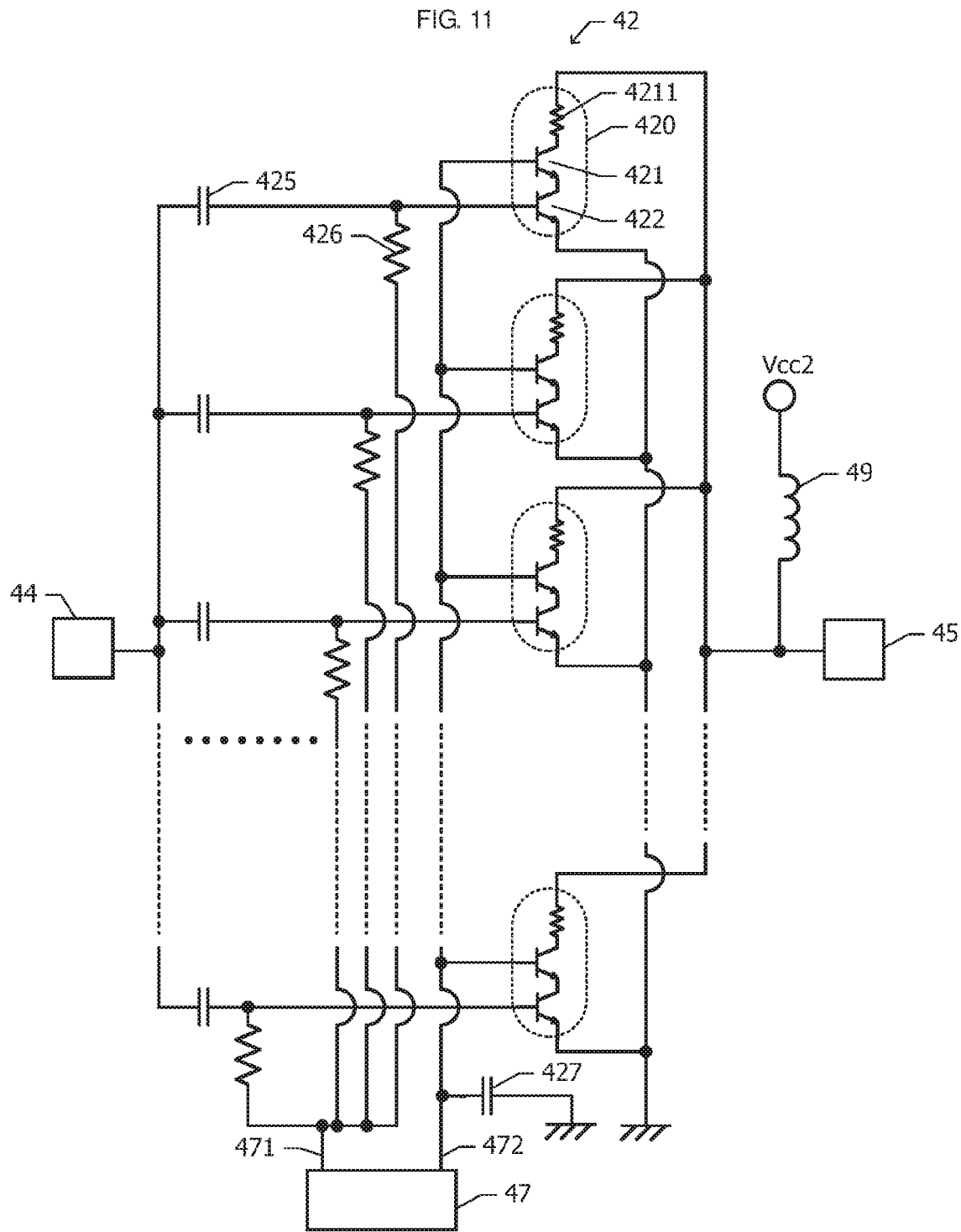
FIG. 11 is an equivalent circuit diagram of an output-stage amplifier circuit in the circuit shown in FIG. 10 included in a radio-frequency power amplifier circuit according to the fifth embodiment.

FIG. 11 is an equivalent circuit diagram of an output-stage amplifier circuit 42 (FIG. 10) included in a radio-frequency power amplifier circuit according to the fifth embodiment. In the fifth embodiment, a first heterojunction bipolar transistor 421 (hereinafter referred to as a "first HBT 421") and a second heterojunction bipolar transistor 422 (hereinafter referred to as a "second HBT 422") are cascode-connected to each other to form a cascode circuit. An emitter of the second HBT 422 is grounded. A collector of the second HBT 422 is connected to an emitter of the first HBT 421. A power supply voltage is supplied to a collector of the first HBT 421 through an inductor 49. The first HBT 421 includes a collector ballast resistor 4211 connected to the collector.

The one cascode circuit composed of the first HBT 421 and the second HBT 422 corresponds to one HBT 420 (FIG. 2) of the first embodiment. In the first embodiment, a plurality of HBTs 420 are connected in parallel. Similarly, a plurality of cascode circuits each composed of the first HBT 421 and the second HBT 422 are connected in parallel in the fifth embodiment. In each of the cascode circuits, the second HBT 422 mainly has a function of improving radio-frequency characteristics, and the first HBT 421 mainly has a function of improving the breakdown voltage.

A bias voltage is applied from an output-stage bias circuit 47 through a first bias supply system 471 to a base of each of the second HBTs 422. Furthermore, a radio-frequency signal is input from an inter-stage matching circuit 44 through a DC cut capacitor 425 to the base of each of the second HBTs 422 as in the case of the first embodiment (FIG. 2). The second HBTs 422 constitute a common-emitter circuit. A base ballast resistor 426 is inserted in the first bias supply system 471 as in the case of the first embodiment (FIG. 2).

A bias voltage is applied from the output-stage bias circuit 47 through a second bias supply system 472 to bases of the first HBTs 421. A direct-current constant voltage is supplied to the bases of the first HBTs 421, and the bases of the first HBTs 421 are alternating-current (AC) grounded via a grounding capacitor 427 with a low impedance. The first HBTs 421 constitute a common-base circuit. The impedance when the output-stage bias circuit 47 is viewed from the base of a first HBT 421 is sufficiently lower than the impedance when the inter-stage matching circuit 44 is viewed from the base of a second HBT 422. For example, the impedance when the output-stage bias circuit 47 is viewed from the base of the first HBT 421 is 1/10 or less the impedance when the inter-stage matching circuit 44 and the output-stage bias circuit 47 are viewed from the base of the second HBT 422.

Figure 12:
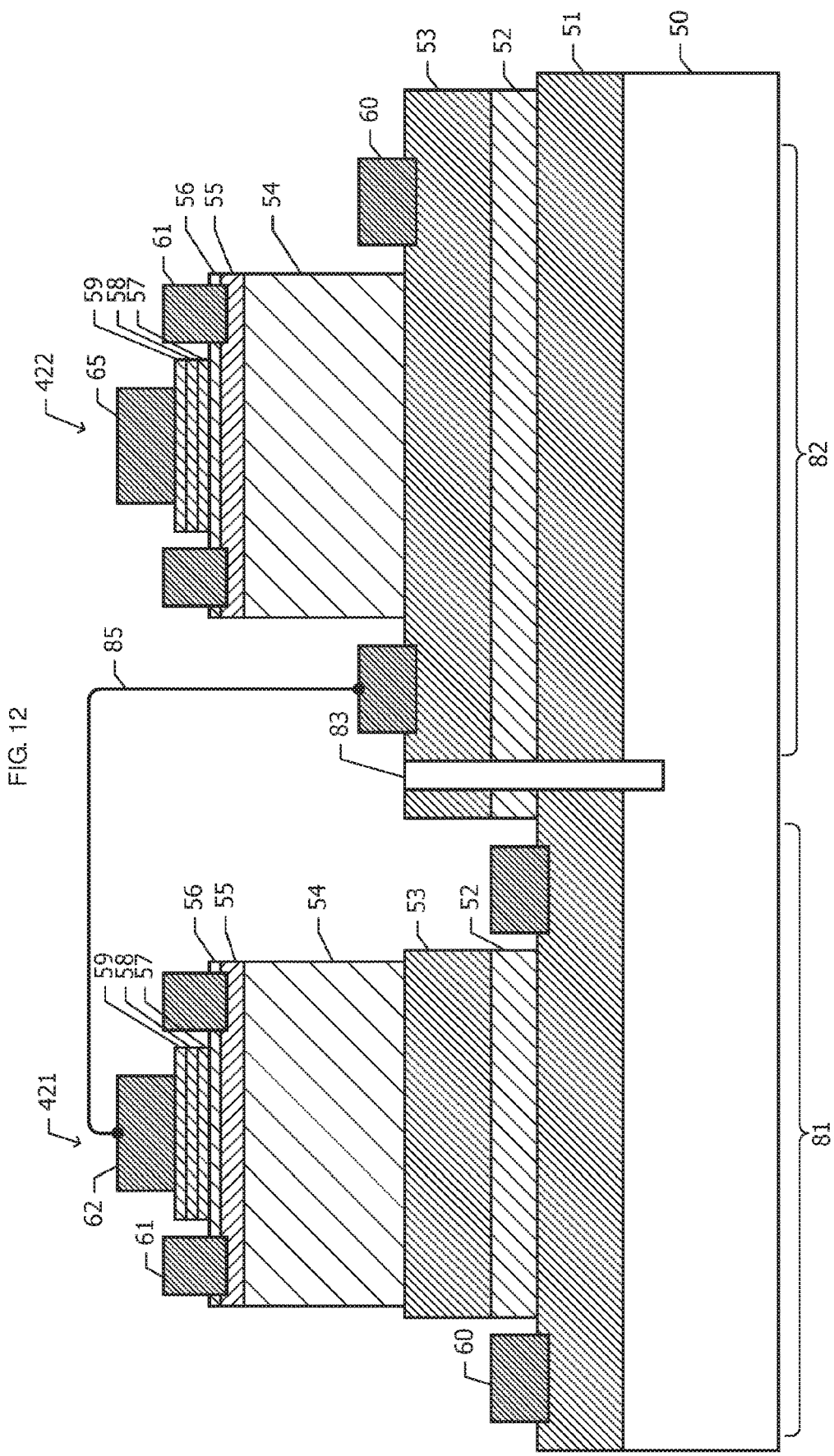
FIG. 12 is a sectional view of a semiconductor device that forms one cascode circuit included in a radio-frequency power amplifier circuit according to the fifth embodiment.

FIG. 12 is a sectional view of a semiconductor device that forms one cascode circuit included in a radio-frequency power amplifier circuit according to the fifth embodiment. A first sub-collector layer 51, a collector ballast resistor layer 52, a second sub-collector layer 53, a collector layer 54, a base layer 55, an emitter layer 56, a first contact layer 57, a second contact layer 58, and a third contact layer 59 are sequentially stacked on a substrate 50 as in the case of the first embodiment (FIG. 3). In a first region 81 within the plane of the substrate 50, the first sub-collector layer 51, the collector ballast resistor layer 52, the second sub-collector layer 53, the collector layer 54, the base layer 55, and the emitter layer 56 form a first HBT 421. In a second region 82 that is different from the first region 81, the second sub-collector layer 53, the collector layer 54, the base layer 55, and the emitter layer 56 form a second HBT 422. The first sub-collector layer 51 and the collector ballast resistor layer 52 are also disposed in the second region 82. The collector ballast resistor layer 52 and semiconductor layers disposed on and above the collector ballast resistor layer 52 are physically isolated in the first region 81 and the second region 82.

A collector electrode 60 of the first HBT 421 is connected to the first sub-collector layer 51 in the first region 81 as in the HBT 420 (FIG. 3) of the first embodiment. A base electrode 61 of the first HBT 421 is connected to the base layer 55 in the first region 81. An emitter electrode 62 of the first HBT 421 is connected to the emitter layer 56 through the third contact layer 59, the second contact layer 58, and the first contact layer 57 in the first region 81. These connection configurations are the same as those in the HBT 420 according to the first embodiment.

A collector electrode 60 of the second HBT 422 is connected to the second sub-collector layer 53 in the second region 82. A base electrode 61 of the second HBT 422 is connected to the base layer 55 in the second region 82. An emitter electrode 62 of the second HBT 422 is connected to the emitter layer 56 through the third contact layer 59, the second contact layer 58, and the first contact layer 57 in the second region 82.

In order to connect the collector electrode 60 to the second sub-collector layer 53 of the second HBT 422, the second sub-collector layer 53 in the second region 82 extends to the outside of the outer periphery of the collector layer 54 in plan view. The collector electrode 60 of the second HBT 422 is disposed on a portion of the second sub-collector layer 53, the portion extending to the outside of the outer periphery of the collector layer 54. In order to realize this structure, an etching mask different from an etching mask used in an etching process of the collector layer 54 is used in an etching process of the second sub-collector layer 53. Therefore, the second sub-collector layer 53 in the first region 81 also has a shape that extends slightly outside the collector layer 54. Specifically, a step is generated at the interface between the second sub-collector layer 53 and the collector layer 54 of the first HBT 421.

The first sub-collector layer 51 in the first region 81 and the first sub-collector layer 51 in the second region 82 are electrically insulated from each other by an isolation portion 83. The isolation portion 83 is formed by, for example, performing ion implantation of H or He to a region deeper than the interface between the first sub-collector layer 51 and the substrate 50.

An interconnection line 85 connects the emitter electrode 62 of the first HBT 421 to the collector electrode 60 of the second HBT 422. Consequently, the collector layer 54 of the second HBT 422 is electrically connected to the emitter layer 56 of the first HBT 421.

Next, advantageous effects of the fifth embodiment will be described. In the fifth embodiment, the cascode connection between the first HBT 421 and the second HBT 422 enables radio-frequency characteristics to be improved and enables the breakdown voltage to enhance. In the cascode connection described in the fifth embodiment, the voltage amplitude between the collector and the emitter of the second HBT 422 is substantially zero, and a radio-frequency voltage is substantially applied only between the emitter and collector of the first HBT 421. Therefore, avalanche multiplication tends to occur in the first HBT 421, and avalanche multiplication is unlikely to occur in the second HBT 422. In the fifth embodiment, since the collector ballast resistor 4211 is connected to the collector of the first HBT 421, in which avalanche multiplication tends to occur, the occurrence of avalanche multiplication in the first HBT 421 can be suppressed. In addition, since the collector ballast resistor layer 52 functioning as the collector ballast resistor 4211 is disposed at a position that substantially overlaps the collector layer 54 of the first HBT 421, an increase in the chip size can be suppressed as in the case of the first embodiment.

Since no collector ballast resistor is connected to the collector of the second HBT 422, in which avalanche multiplication is unlikely to occur, a decrease in the output can be prevented.

The layered structure of the semiconductor layers in the first region 81 in which the first HBT 421 is disposed is the same as the layered structure of the semiconductor layers in the second region 82 in which the second HBT 422 is disposed. The second HBT 422 to which no collector ballast resistor is connected is formed in the second region 82 in a state where the collector ballast resistor layer 52 remains in the second region 82. Therefore, the production process can be simplified compared with the case where the collector ballast resistor layer 52 in the second region 82 is removed.

Sixth Embodiment

Next, a radio-frequency power amplifier circuit according to a sixth embodiment will be described with reference to FIG. 13. Hereafter, descriptions of configurations that are common to those of the radio-frequency power amplifier circuit according to the fifth embodiment (FIGS. 10, 11, and 12) will be omitted.

Figure 13:
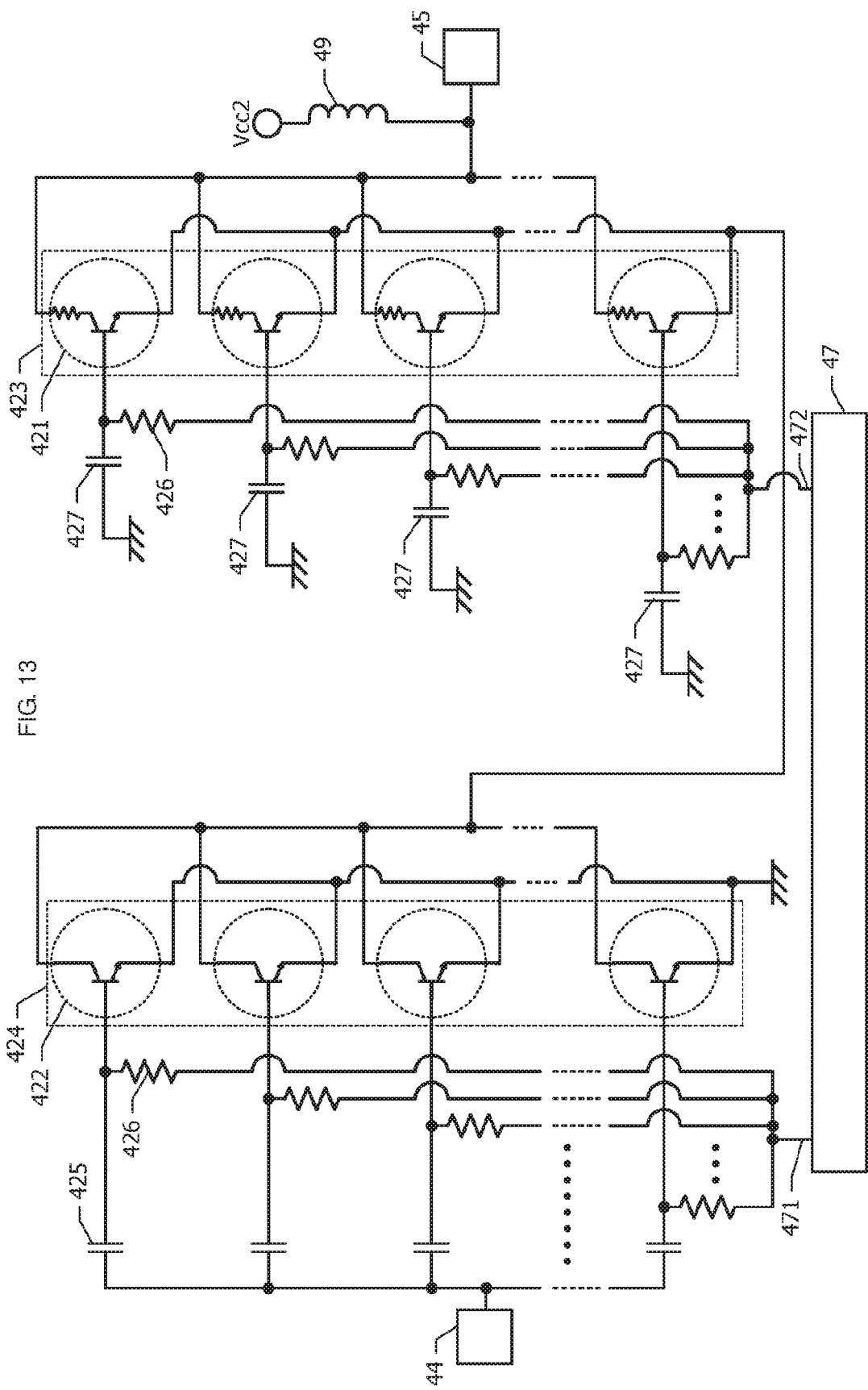
FIG. 13 is an equivalent circuit diagram of an output-stage amplifier circuit in the circuit shown in FIG. 10 included in a radio-frequency power amplifier circuit according to a sixth embodiment.

FIG. 13 is an equivalent circuit diagram of an output-stage amplifier circuit 42 (FIG. 10) included in a radio-frequency power amplifier circuit according to the sixth embodiment. In the fifth embodiment (FIG. 11), a plurality of cascode circuits each composed of the first HBT 421 and the second HBT 422 are connected in parallel to form the output-stage amplifier circuit 42. In contrast, in the sixth embodiment, a first parallel circuit 423 composed of a plurality of first HBTs 421 connected in parallel and a second parallel circuit 424 composed of a plurality of second HBTs 422 connected in parallel are cascode-connected to each other to form an output-stage amplifier circuit 42. A base ballast resistor 426 is connected to a base of each of the plurality of first HBTs 421. In the fifth embodiment (FIG. 11), the bases of the plurality of first HBTs 421 are AC grounded via a single capacitor 427. In the sixth embodiment, each of the bases of the plurality of first HBTs 421 is AC grounded via a base-grounding capacitor 427 with a low impedance.

Next, advantageous effects of the sixth embodiment will be described. Advantageous effects that are the same as or similar to those of the fifth embodiment are also achieved in the sixth embodiment. In the fifth embodiment, for each of the HBTs 420, the isolation portion 83 (FIG. 12) is provided between the first HBT 421 and the second HBT 422. In contrast, in the sixth embodiment, a single isolation portion is provided between the first parallel circuit 423 composed of the plurality of first HBTs 421 and the second parallel circuit 424 composed of the plurality of second HBTs 422.

Seventh Embodiment

Next, a radio-frequency power amplifier circuit according to a seventh embodiment will be described with reference to FIGS. 14 and 15. Hereafter, descriptions of configurations that are common to those of the radio-frequency power amplifier circuit according to the fifth embodiment (FIGS. 10, 11, and 12) will be omitted.

Figure 14:
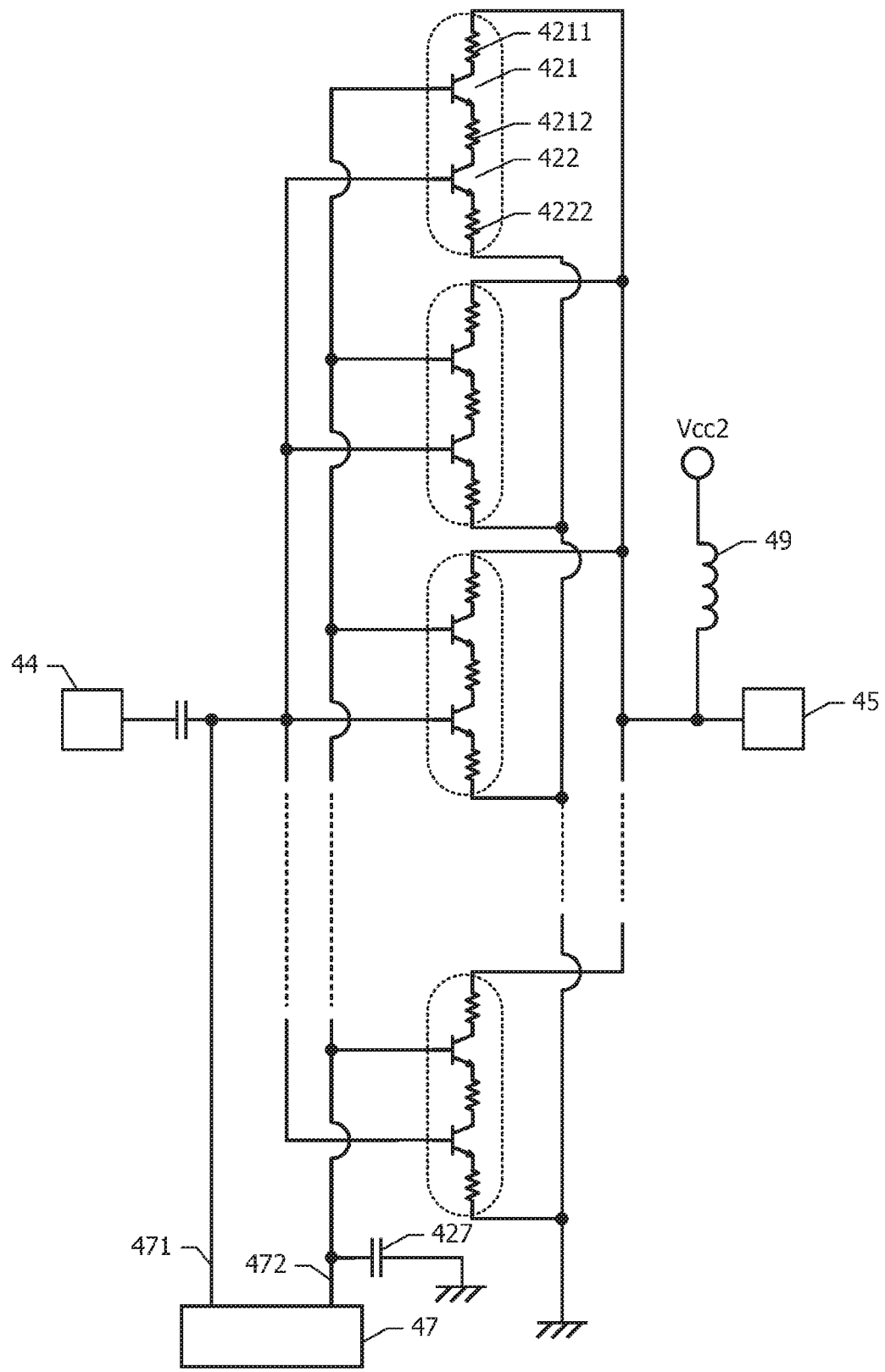
FIG. 14 is an equivalent circuit diagram of an output-stage amplifier circuit in the circuit shown in FIG. 10 included in a radio-frequency power amplifier circuit according to a seventh embodiment.

FIG. 14 is an equivalent circuit diagram of an output-stage amplifier circuit 42 (FIG. 10) included in a radio-frequency power amplifier circuit according to the seventh embodiment. In the fifth embodiment, the base ballast resistor 426 is connected to the base of each of the plurality of second HBTs 422. In the seventh embodiment, no base ballast resistors are connected to bases of the second HBTs 422. Alternatively, an emitter ballast resistor 4222 connected to an emitter is included in each of the second HBTs 422 as in the second embodiment (FIG. 5). Each of the emitters of the second HBTs 422 is grounded via the corresponding emitter ballast resistor 4222. Furthermore, first HBTs 421 also include emitter ballast resistors 4212 connected to emitters. Accordingly, a collector of each of the second HBTs 422 is connected to the emitter of the corresponding first HBT 421 with the corresponding emitter ballast resistor 4212 therebetween to form a cascode circuit.

Figure 15:
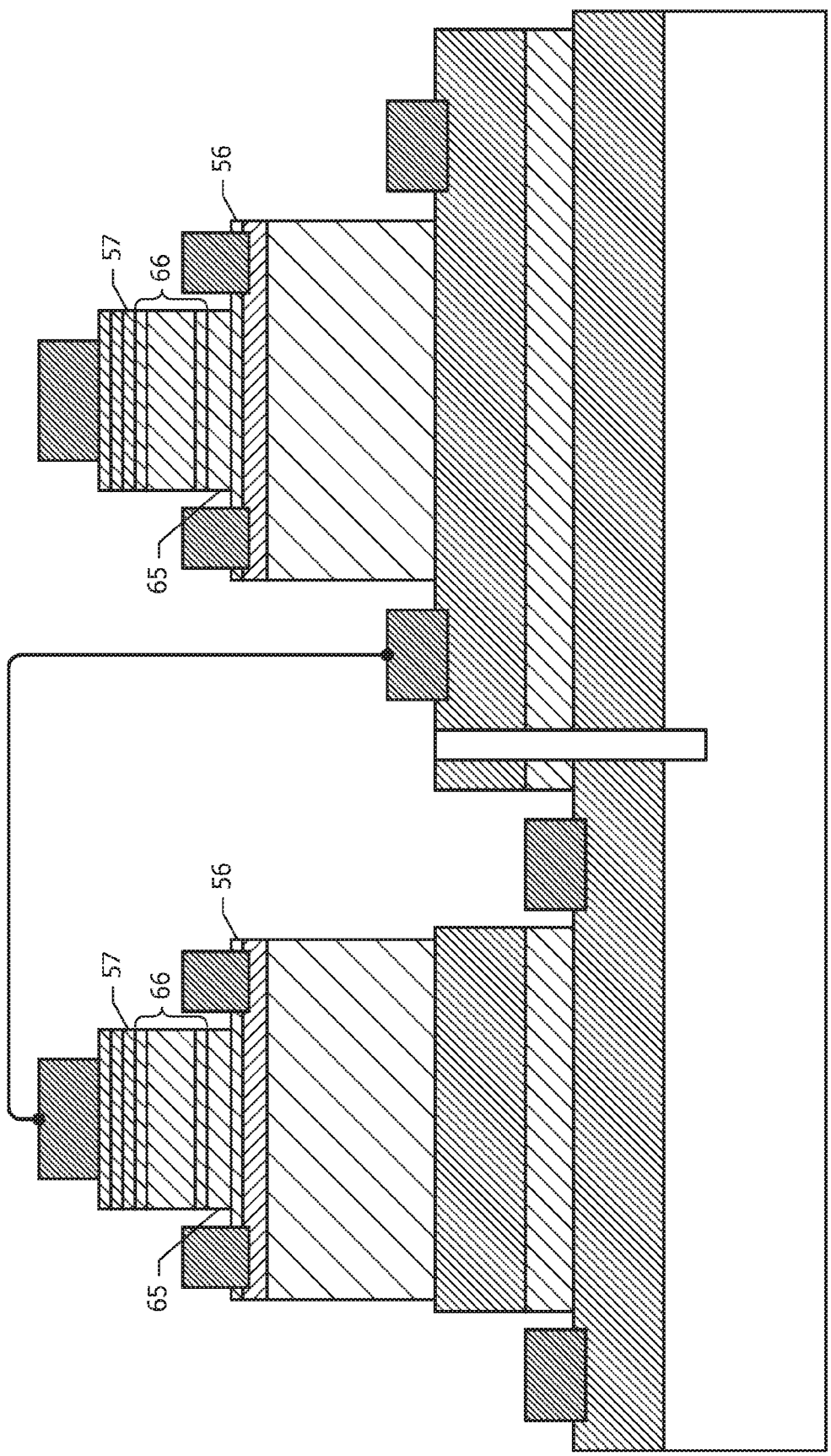
FIG. 15 is a sectional view of a semiconductor device that forms one cascode circuit included in a radio-frequency power amplifier circuit according to the seventh embodiment.

FIG. 15 is a sectional view of a semiconductor device that forms one cascode circuit included in a radio-frequency power amplifier circuit according to the seventh embodiment. In the cascode circuit (FIG. 12) according to the fifth embodiment, the first contact layer 57 is disposed directly on the emitter layer 56. In the seventh embodiment, a spacer layer 65 and an emitter ballast resistor layer 66 are disposed between an emitter layer 56 and a first contact layer 57 as in the second embodiment (FIG. 6).

Next, advantageous effects of the seventh embodiment will be described.

In the seventh embodiment, the emitter ballast resistors 4212 and 4222 have functions of suppressing thermal runaway of the first HBTs 421 and the second HBTs 422, respectively. Furthermore, since no base ballast resistors are provided, the effect of suppressing the occurrence of avalanche multiplication, the effect being achieved by the collector ballast resistors 4211, is not reduced as in the second embodiment.

Eighth Embodiment

Next, a radio-frequency power amplifier circuit according to an eighth embodiment will be described with reference to FIG. 16. Hereafter, descriptions of configurations that are common to those of the radio-frequency power amplifier circuit according to the sixth embodiment (FIG. 13) will be omitted.

Figure 16:
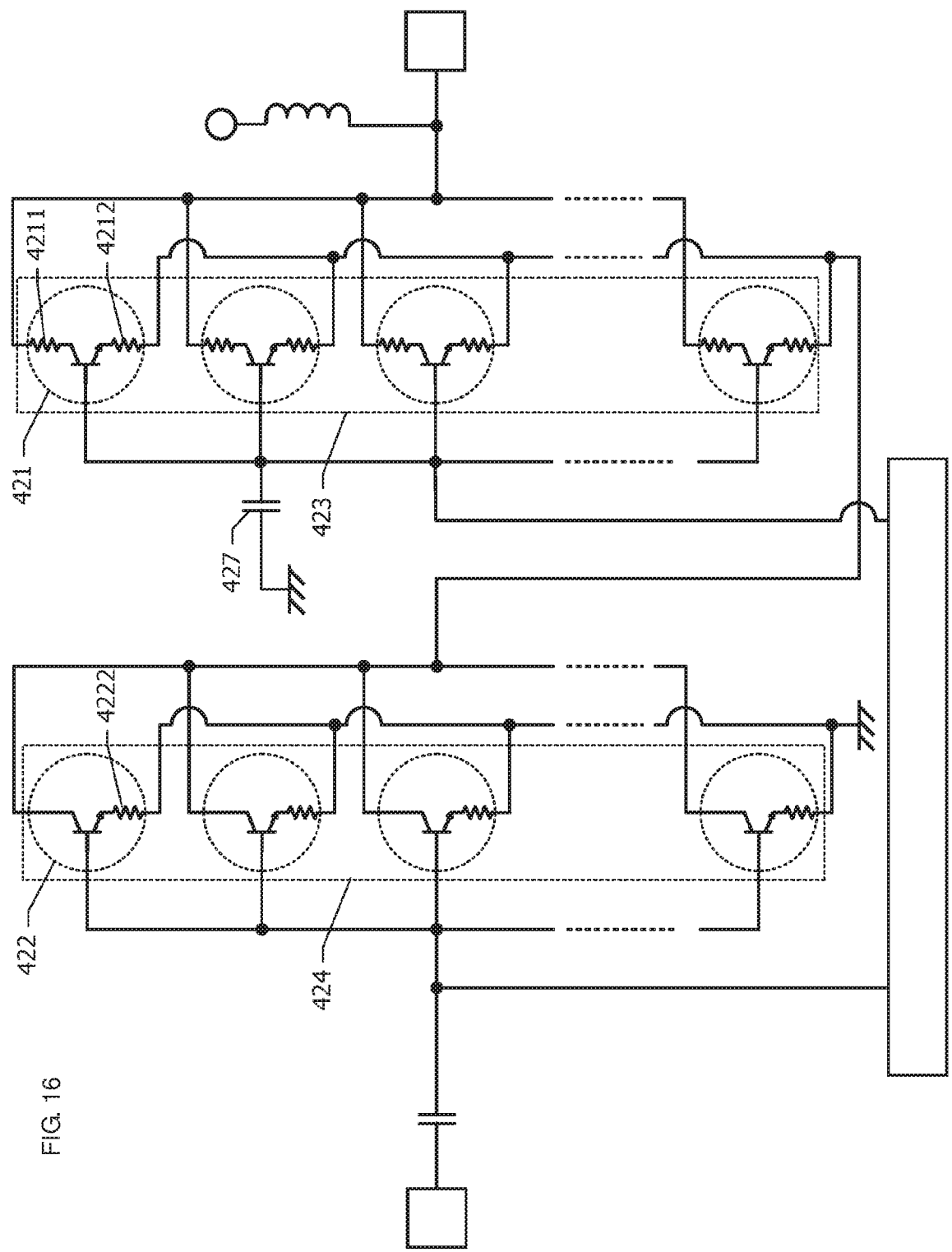
FIG. 16 is an equivalent circuit diagram of an output-stage amplifier circuit in the circuit shown in FIG. 10 included in a radio-frequency power amplifier circuit according to an eighth embodiment.

FIG. 16 is an equivalent circuit diagram of an output-stage amplifier circuit 42 (FIG. 10) included in a radio-frequency power amplifier circuit according to the eighth embodiment. In the sixth embodiment (FIG. 13), the base ballast resistor 426 is connected to the base of each of the second HBTs 422. In contrast, in the eighth embodiment, no base ballast resistors are connected to bases of second HBTs 422, and the second HBTs 422 include emitter ballast resistors 4222 connected to emitters. Similarly, no base ballast resistors are connected to bases of first HBTs 421, and the first HBTs 421 include emitter ballast resistors 4212 connected to emitters. Furthermore, the first HBTs 421 include collector ballast resistors 4211 connected to collectors. Since no base ballast resistors are connected, one grounding capacitor 427 is provided for the plurality of first HBTs 421.

Next, advantageous effects of the eighth embodiment will be described. In the eighth embodiment, since no base ballast resistors are disposed, the effect of suppressing the occurrence of avalanche multiplication, the effect being achieved by the collector ballast resistors 4211, is not reduced as in the seventh embodiment (FIG. 14) and the second embodiment (FIG. 5).

Ninth Embodiment

Next, a radio-frequency power amplifier circuit according to a ninth embodiment will be described with reference to FIGS. 17 to 26. Hereafter, descriptions of configurations that are common to those of the radio-frequency power amplifier circuit according to the fifth embodiment (FIGS. 10, 11, and 12) will be omitted.

Figure 17:
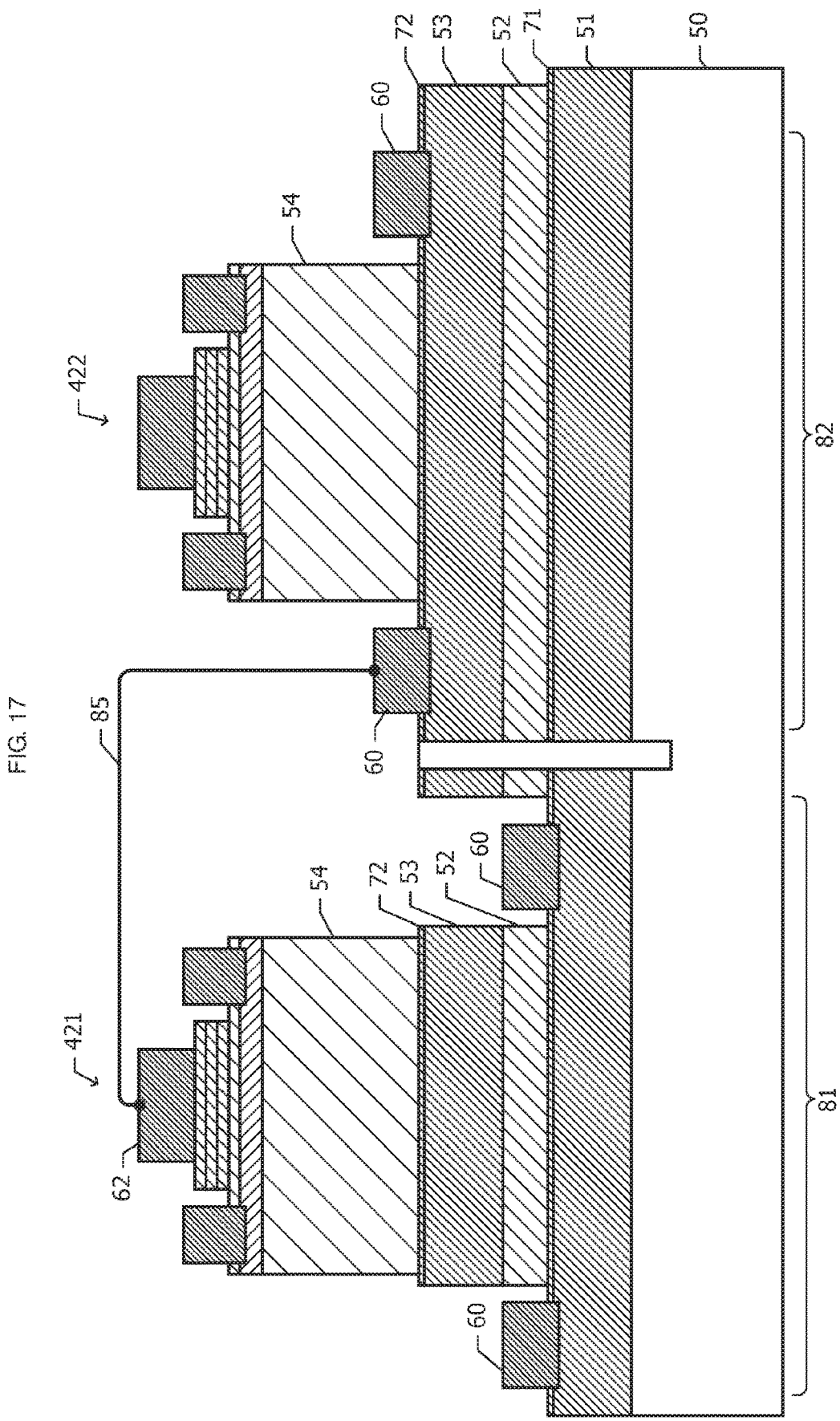
FIG. 17 is a sectional view of a semiconductor device that forms one cascode circuit included in a radio-frequency power amplifier circuit according to a ninth embodiment.

FIG. 17 is a sectional view of a semiconductor device that forms one cascode circuit included in a radio-frequency power amplifier circuit according to the ninth embodiment. A first HBT 421 is formed in a first region 81 of a substrate 50, a second HBT 422 is formed in a second region 82 of the substrate 50, and the first HBT 421 and the second HBT 422 are cascode-connected to each other, as in the fifth embodiment (FIG. 12).

In the fifth embodiment (FIG. 12), the first sub-collector layer 51 and the collector ballast resistor layer 52 are in direct contact with each other. In contrast, in the ninth embodiment, a first etching stopper layer 71 is disposed between a first sub-collector layer 51 and a collector ballast resistor layer 52 as in the third embodiment (FIG. 8). In the fifth embodiment (FIG. 12), the second sub-collector layer 53 and the collector layer 54 are in direct contact with each other. In contrast, in the ninth embodiment, a second etching stopper layer 72 is disposed between a second sub-collector layer 53 and a collector layer 54. Each of the first etching stopper layer 71 and the second etching stopper layer 72 is made of n-type InGaP having a Si doping concentration of $5 \times 10^{18}$ cm$^{-3}$ and a molar ratio of InP of 0.48 and has a thickness of 5 nm.

The first etching stopper layer 71 is disposed over the entire region of the upper surface of the first sub-collector layer 51 as in the third embodiment (FIG. 8). The first etching stopper layer 71 has an opening in a region where a collector electrode 60 of the first HBT 421 is disposed. The collector electrode 60 is in ohmic contact with the first sub-collector layer 51.

The second etching stopper layer 72 is disposed over the entire region of the upper surface of the second sub-collector layer 53. A collector electrode 60 of the second HBT 422 is disposed in an opening formed in the second etching stopper layer 72 and is in ohmic contact with the second sub-collector layer 53.

Next, a method for producing a semiconductor device used in the radio-frequency power amplifier circuit according to the ninth embodiment will be described with reference to FIGS. 18 to 26. FIGS. 18 to 26 are each a sectional view of a first HBT 421 and a second HBT 422 that are cascode-connected to each other during its production.

Figure 18:
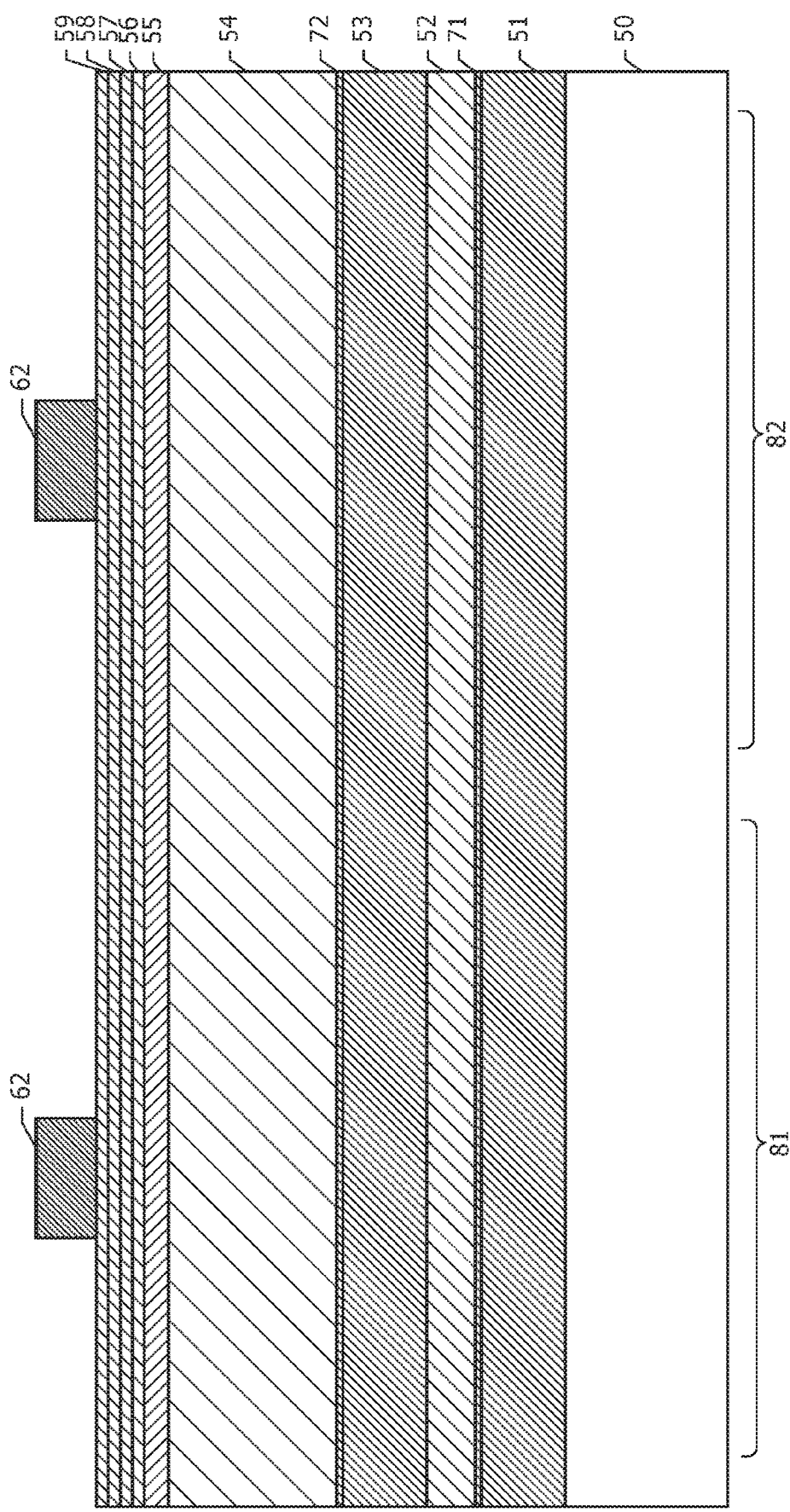
FIG. 18 is a sectional view of a semiconductor device according to the ninth embodiment during its production.

As illustrated in FIG. 18, a first sub-collector layer 51, a first etching stopper layer 71, a collector ballast resistor layer 52, a second sub-collector layer 53, a second etching stopper layer 72, a collector layer 54, a base layer 55, an emitter layer 56, a first contact layer 57, a second contact layer 58, and a third contact layer 59 are sequentially epitaxially grown on a substrate 50 made of semi-insulating GaAs. For example, metalorganic vapor phase epitaxy can be used for the growth of these semiconductor layers.

An emitter electrode 62 of a first HBT 421 (FIG. 17) and an emitter electrode 62 of a second HBT 422 (FIG. 17) are formed on partial regions of the third contact layer 59 in a first region 81 and a second region 82, respectively. These emitter electrodes 62 can be formed by, for example, photolithography, vapor deposition, and a lift-off process.

Figure 19:
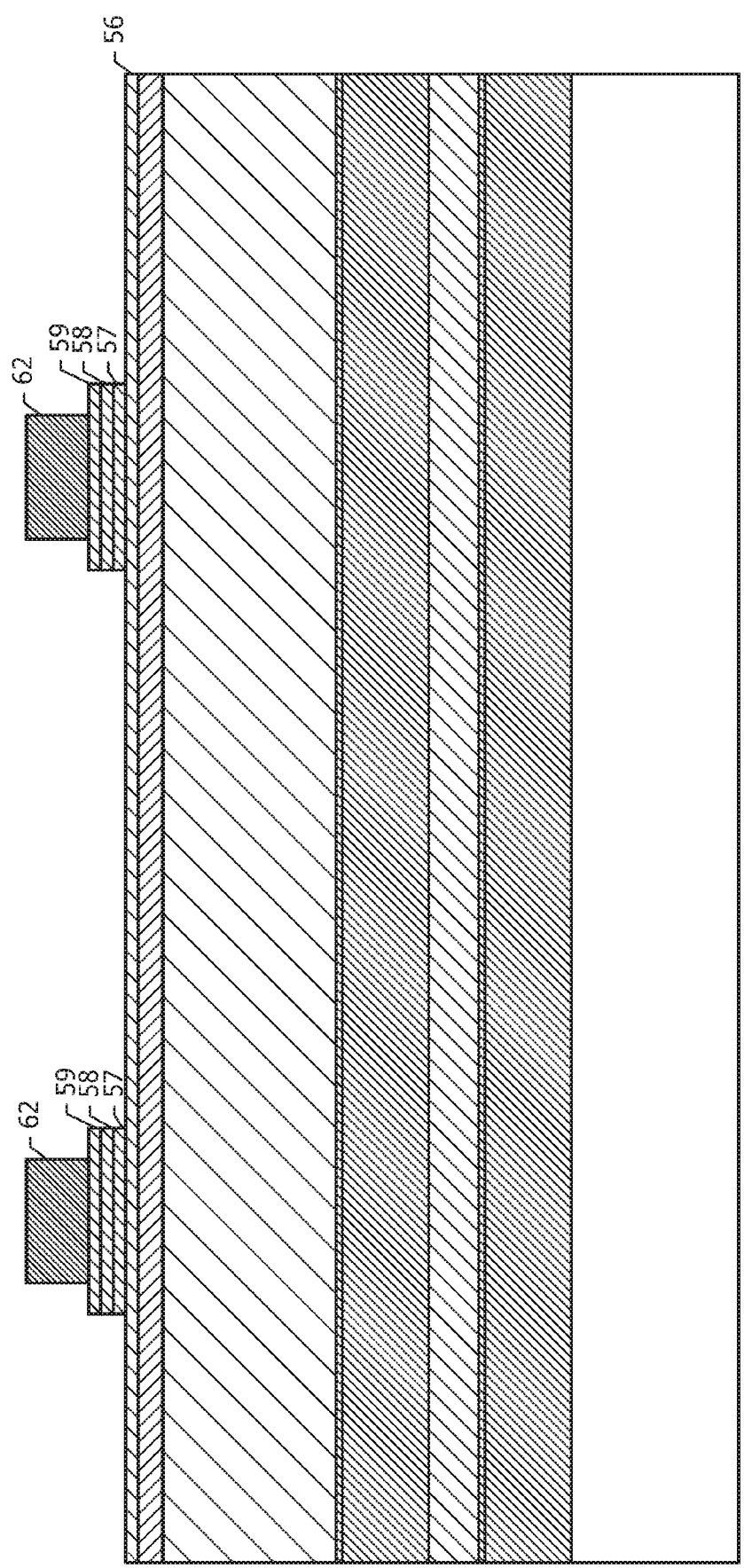
FIG. 19 is a sectional view of a semiconductor device according to the ninth embodiment during its production.

As illustrated in FIG. 19, unnecessary portions of the third contact layer 59, the second contact layer 58, and the first contact layer 57 are removed by etching by using a photoresist (not shown) as an etching mask. This etching can be performed by, for example, wet etching using an etchant prepared by mixing phosphoric acid having a concentration of 85% by weight, a hydrogen peroxide solution having a concentration of 35% by weight, and water at a volume ratio of 1:2:40. This etchant has such etching selectivity that three layers from the third contact layer 59 to the first contact layer 57 are selectively etched with respect to the emitter layer 56 made of n-type InGaP.

Figure 20:
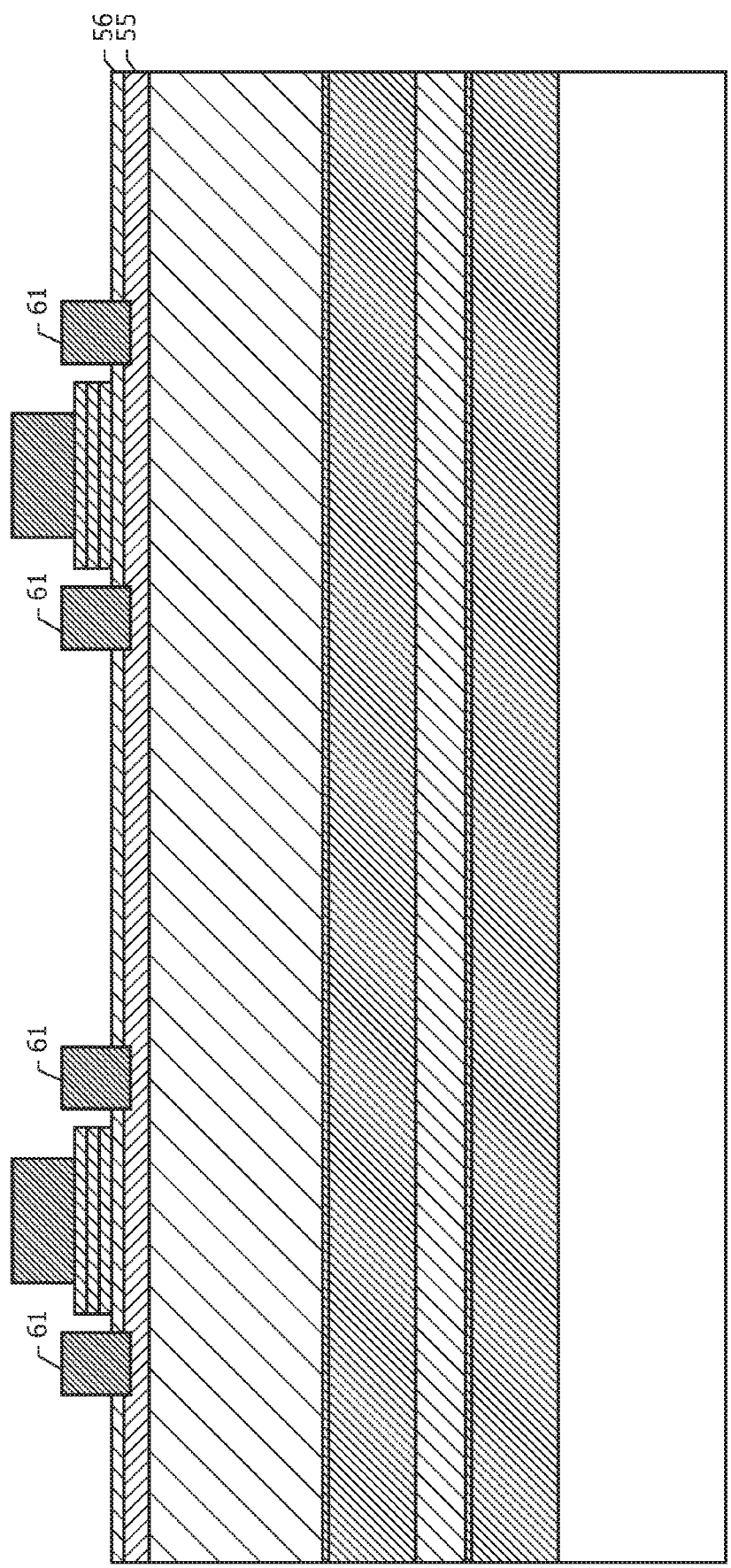
FIG. 20 is a sectional view of a semiconductor device according to the ninth embodiment during its production.

As illustrated in FIG. 20, base electrodes 61 are formed on predetermined regions of the emitter layer 56. The base electrodes 61 can be formed by, for example, photolithography, vapor deposition, and a lift-off process. After the formation of the base electrodes 61, sintering is performed to thereby bring each of the base electrode 61 into ohmic contact with the base layer 55.

Figure 21:
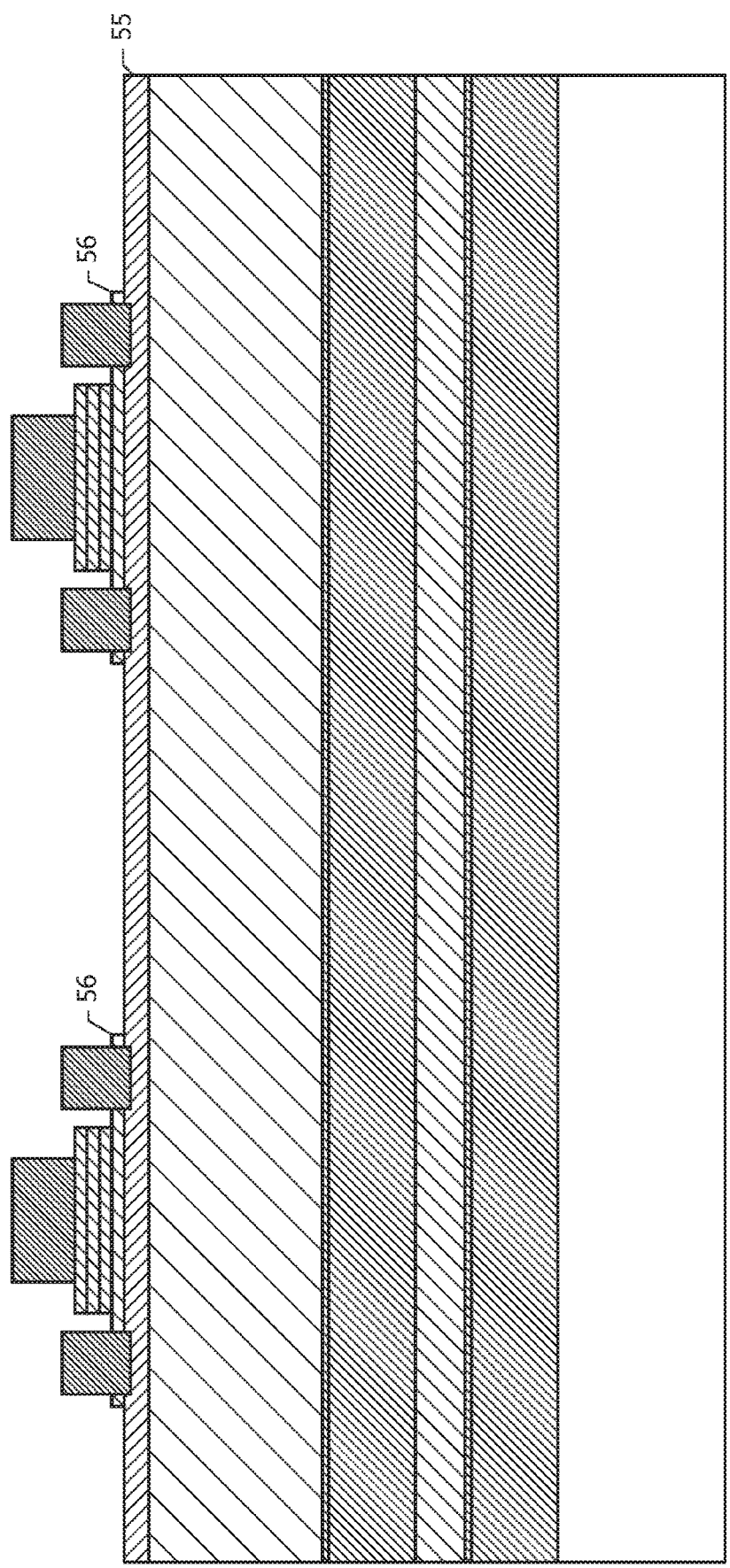
FIG. 21 is a sectional view of a semiconductor device according to the ninth embodiment during its production.

As illustrated in FIG. 21, an unnecessary portion of the emitter layer 56 is removed by etching by using a photoresist (not shown) as an etching mask to expose the base layer 55. The etching of the emitter layer 56 can be performed by wet etching using hydrochloric acid as an etchant. This etchant has such etching selectivity that the emitter layer 56 made of n-type InGaP is selectively etched with respect to the base layer 55 made of p-type GaAs.

Figure 22:
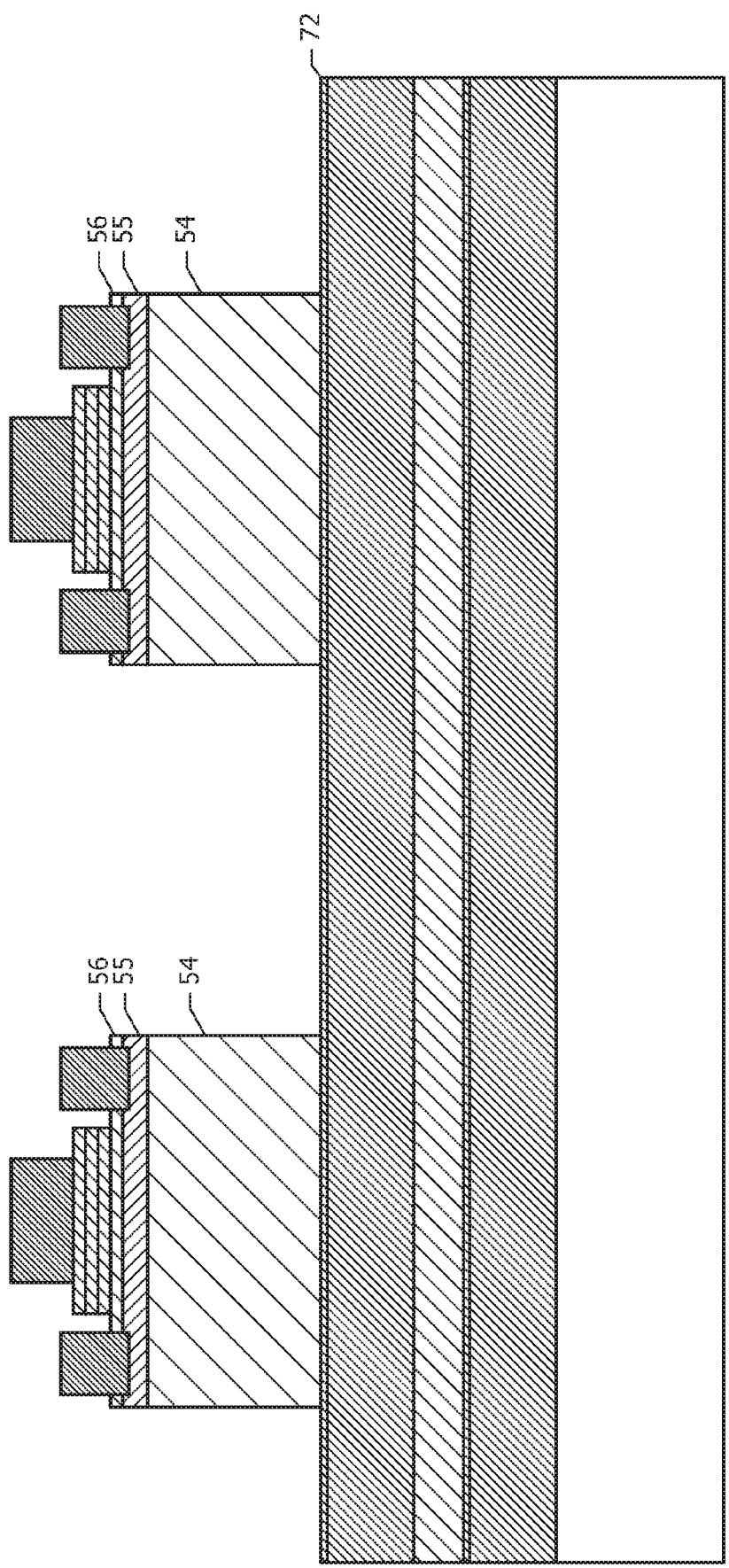
FIG. 22 is a sectional view of a semiconductor device according to the ninth embodiment during its production.

As illustrated in FIG. 22, unnecessary portions of the base layer 55 and the collector layer 54 are removed by etching by using the etching mask (not shown) used in the etching of the emitter layer 56 (FIG. 21) as it is. For this etching, the same etchant as that used for etching the three layers from the third contact layer 59 to the first contact layer 57 (FIG. 19) can be used. This etchant has such etching selectivity that the collector layer 54 made of n-type GaAs is selectively etched with respect to the second etching stopper layer 72 made of n-type InGaP.

Figure 23:
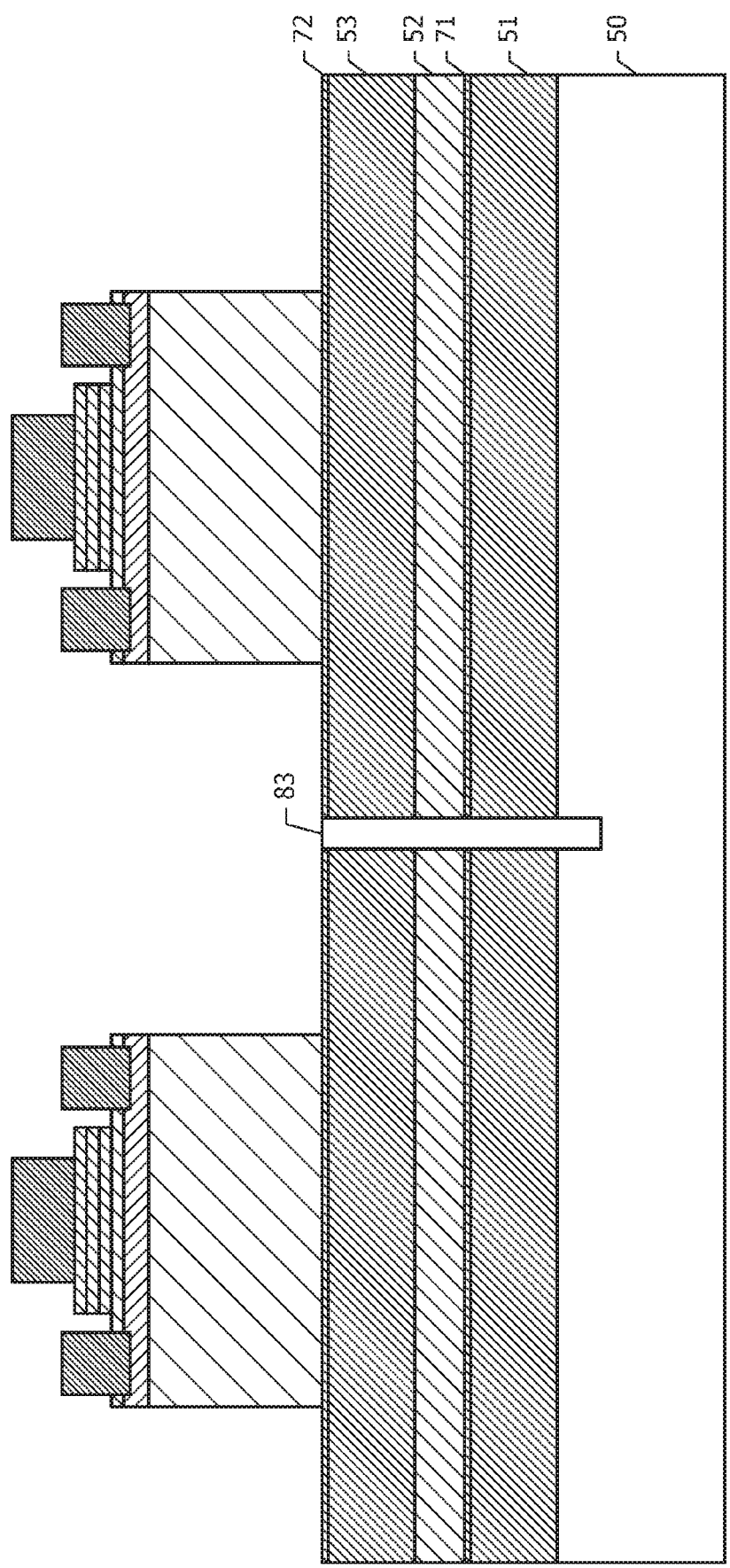
FIG. 23 is a sectional view of a semiconductor device according to the ninth embodiment during its production.

As illustrated in FIG. 23, an isolation portion 83 is formed by ion implantation. For example, H or He can be used as the ion species for forming the isolation portion 83. The isolation portion 83 reaches a position deeper than the interface between the first sub-collector layer 51 and the substrate 50.

Figure 24:
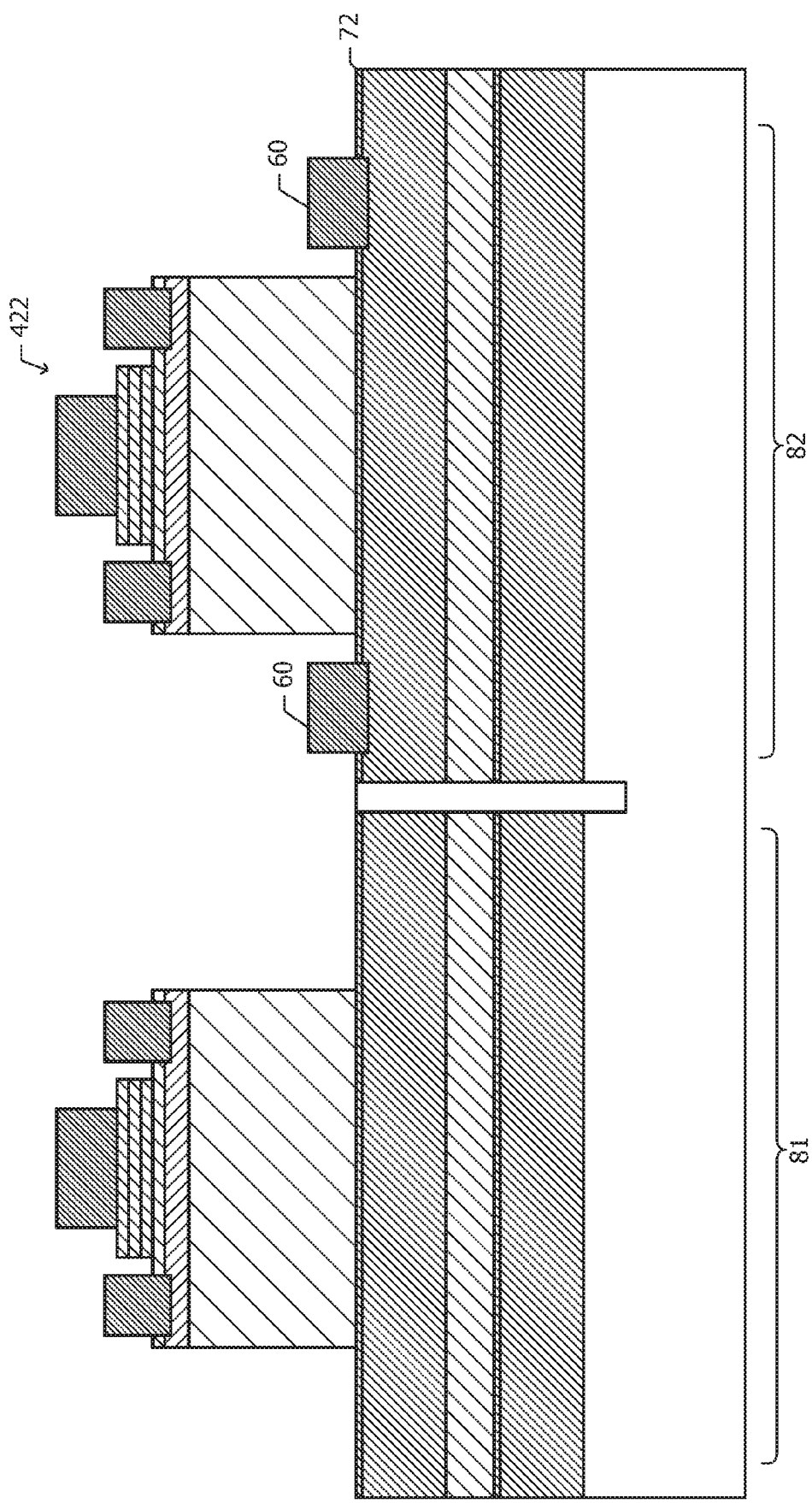
FIG. 24 is a sectional view of a semiconductor device according to the ninth embodiment during its production.

As illustrated in FIG. 24, a collector electrode 60 of the second HBT 422 is formed on the second etching stopper layer 72 in the second region 82. The collector electrode 60 is formed by forming an opening in the second etching stopper layer 72 using a photoresist as an etching mask, depositing a metal layer serving as a collector electrode 60 in the opening by vapor deposition, and subsequently performing a lift-off process.

Figure 25:
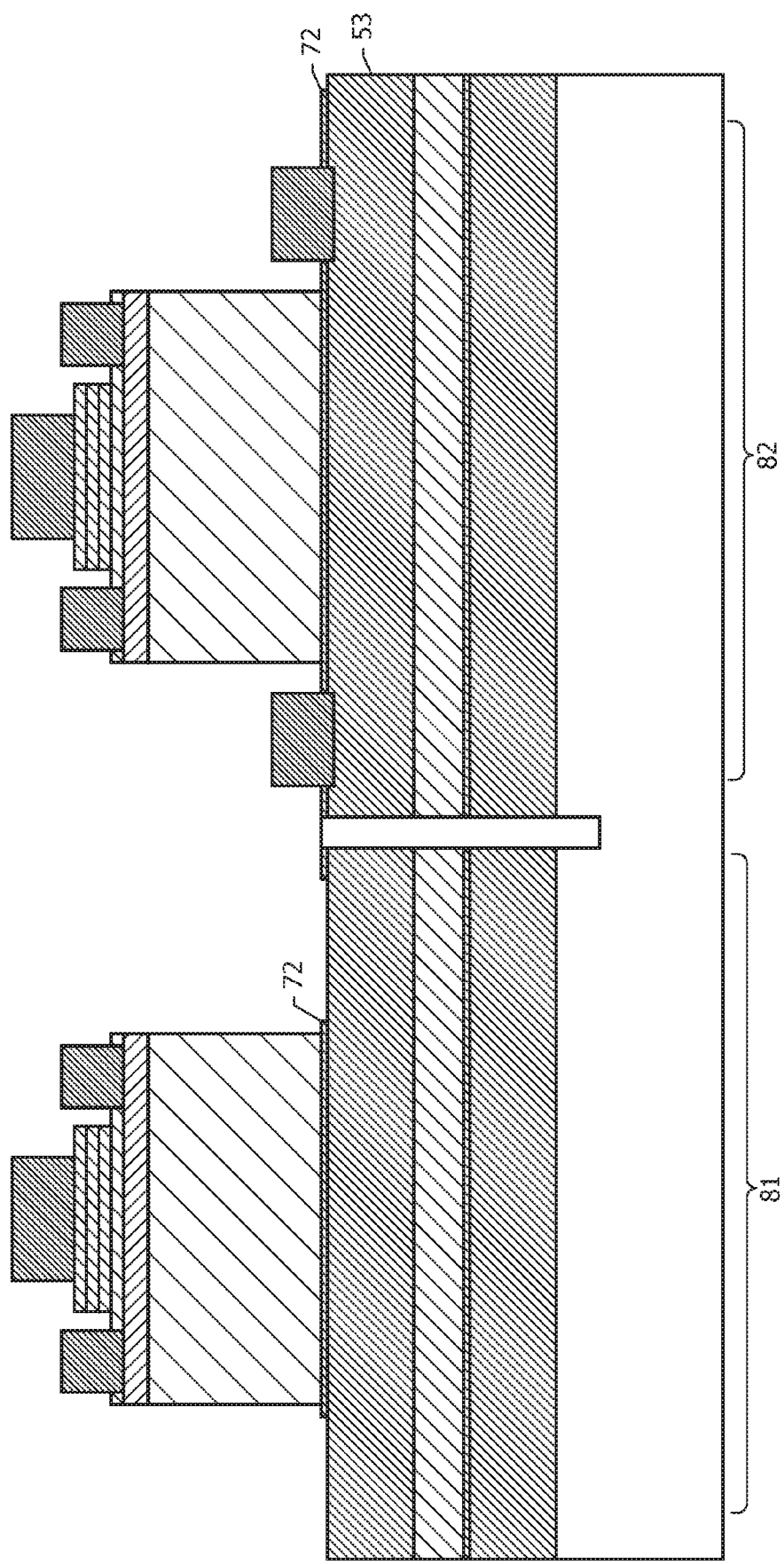
FIG. 25 is a sectional view of a semiconductor device according to the ninth embodiment during its production.

As illustrated in FIG. 25, an unnecessary second etching stopper layer 72 in the first region 81 is removed by using a photoresist as an etching mask (not shown) to expose the second sub-collector layer 53. This etching can be performed by wet etching using hydrochloric acid. This etchant has such etching selectivity that the second etching stopper layer 72 made of n-type InGaP is selectively etched with respect to the second sub-collector layer 53 made of n-type GaAs.

Figure 26:
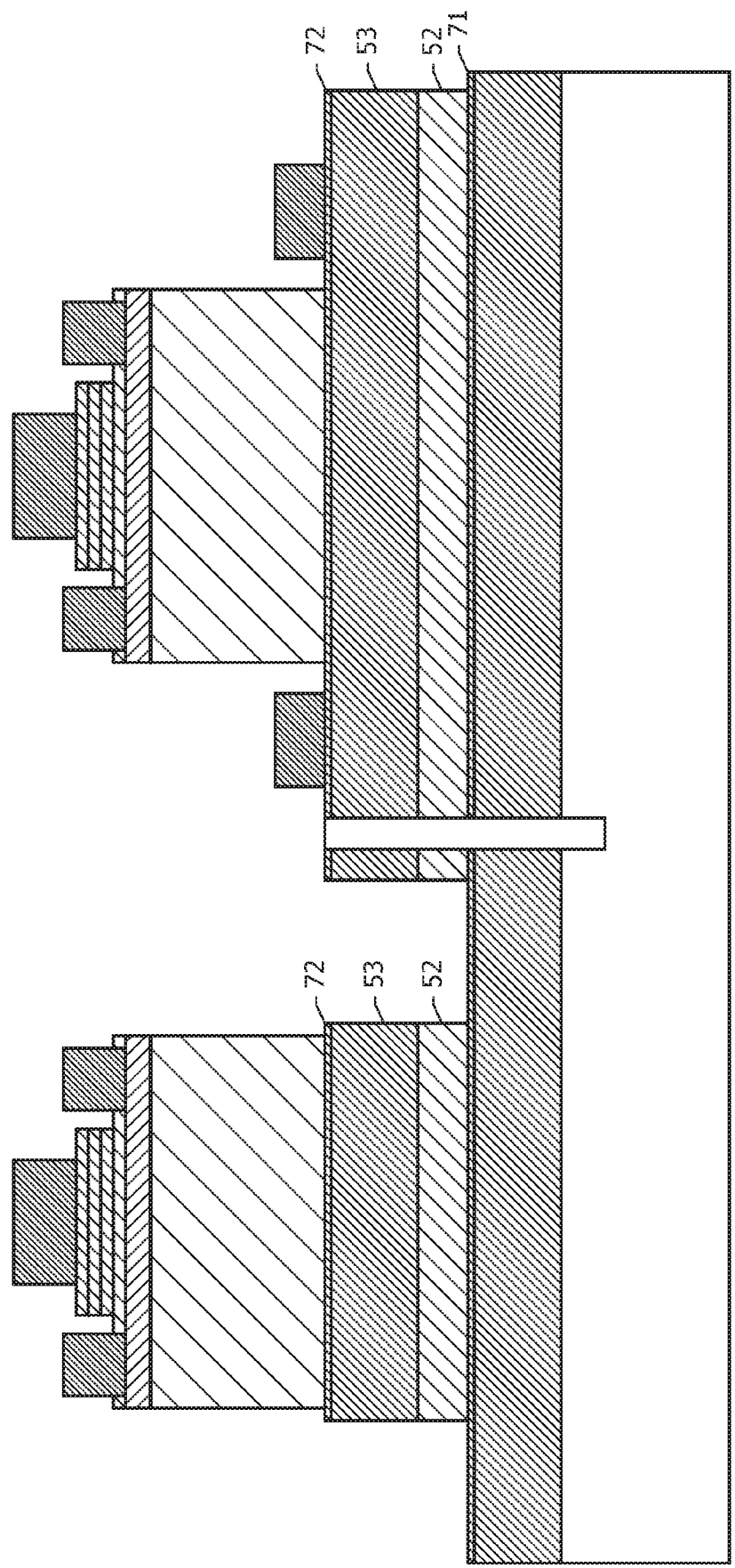
FIG. 26 is a sectional view of a semiconductor device according to the ninth embodiment during its production.

As illustrated in FIG. 26, unnecessary portions of the second sub-collector layer 53 and the collector ballast resistor layer 52 are removed by etching using the etching mask (not shown) used in the etching of the second etching stopper layer 72 (FIG. 25) as it is. This etching can be performed by using the same etchant as the etchant used in the etching of the three layers from the third contact layer 59 to the first contact layer 57 (FIG. 19). This etchant has such etching selectivity that the collector ballast resistor layer 52 made of n-type AlGaAs is selectively etched with respect to the first etching stopper layer 71 made of n-type InGaP.

As illustrated in FIG. 17, a collector electrode 60 of the first HBT 421 is formed in the first region 81. The collector electrode 60 is formed by forming an opening in the first etching stopper layer 71 using a photoresist as an etching mask, depositing a metal layer serving as a collector electrode 60 in the opening by vapor deposition, and subsequently performing a lift-off process.

Subsequently, for example, formation of a resistor formed into a base ballast resistor 426 (FIG. 11), formation of an interlayer insulating film, formation of wiring lines, formation of a passivation film, reduction in the thickness of the substrate 50, and chip separation are performed.

Next, advantageous effects of the ninth embodiment will be described. In the ninth embodiment, the occurrence of avalanche multiplication can be suppressed, and an increase in the chip size can be suppressed as in the fifth embodiment. Furthermore, since the first etching stopper layer 71 and the second etching stopper layer 72 are disposed, controllability of the etching depth can be enhanced. As a result, an improvement in the yield can be realized.

Tenth Embodiment

Next, an HBT according to a tenth embodiment will be described with reference to FIG. 27. Hereafter, descriptions of configurations that are common to those of the HBT according to the first embodiment (FIG. 3) will be omitted.

Figure 27:
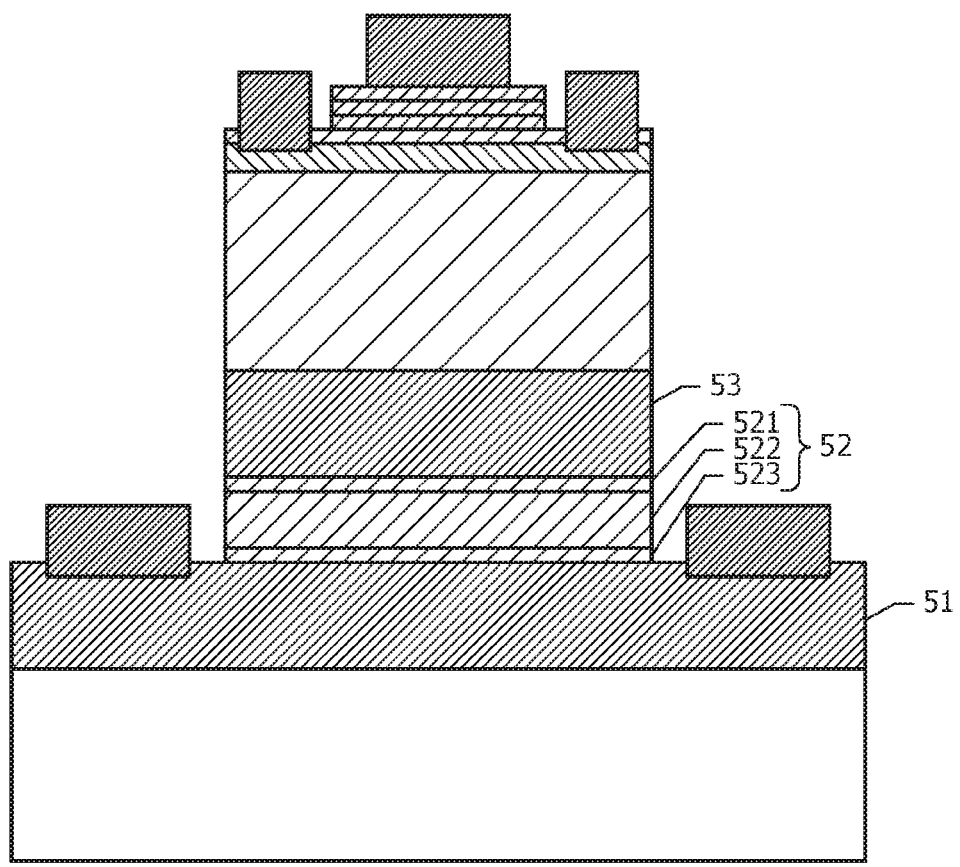
FIG. 27 is a sectional view of an HBT according to a tenth embodiment.

FIG. 27 is a sectional view of an HBT according to the tenth embodiment. In the first embodiment, the collector ballast resistor layer 52 is formed of n-type AlGaAs having a uniform composition. In contrast, in the tenth embodiment, a collector ballast resistor layer 52 includes three layers, namely, a first collector ballast resistor layer 521, a second collector ballast resistor layer 522, and a third collector ballast resistor layer 523. The first collector ballast resistor layer 521 is in contact with a second sub-collector layer 53. The third collector ballast resistor layer 523 is in contact with a first sub-collector layer 51. The second collector ballast resistor layer 522 is disposed between the first collector ballast resistor layer 521 and the third collector ballast resistor layer 523.

Each of the first collector ballast resistor layer 521, the second collector ballast resistor layer 522, and the third collector ballast resistor layer 523 is formed of n-type AlGaAs having a Si doping concentration of $1\times10^{17}$ cm$^{-3}$. The molar ratio of AlAs of the third collector ballast resistor layer 523 is changed from 0 to 0.33 in a direction from the bottom toward the top. The molar ratio of AlAs of the second collector ballast resistor layer 522 is constant at 0.33. The molar ratio of AlAs of the first collector ballast resistor layer 521 is changed from 0.33 to 0 in a direction from the bottom toward the top. The first collector ballast resistor layer 521 and the third collector ballast resistor layer 523 each have a thickness of 50 nm, and the second collector ballast resistor layer 522 has a thickness of 200 nm.

Next, advantageous effects of the tenth embodiment will be described. The tenth embodiment has, in addition to the advantageous effects of the first embodiment, an advantageous effect in that discontinuity of the energy at the lower edge of the conduction band at the interface between the first sub-collector layer 51 and the collector ballast resistor layer 52 can be eliminated. Furthermore, the tenth embodiment has an advantageous effect in that discontinuity of the energy at the lower edge of the conduction band at the interface between the collector ballast resistor layer 52 and the second sub-collector layer 53 can be eliminated. With this structure, the generation of a potential barrier that is unnecessary for an electron can be suppressed.

Next, modifications of the tenth embodiment will be described.

In the tenth embodiment, the first collector ballast resistor layer 521, the second collector ballast resistor layer 522, and the third collector ballast resistor layer 523 have the same Si doping concentration. However, the Si doping concentrations are not necessarily the same. In order to allow the collector ballast resistor layer 52 including three layers to function as a collector ballast resistor, the Si doping concentrations of the three layers are each preferably $1\times10^{18}$ cm$^{-3}$ or less.

In the tenth embodiment, the molar ratio of AlAs of the second collector ballast resistor layer 522 is 0.33. The molar ratio of AlAs is preferably 0.43 or less. In this case, the molar ratio of AlAs of the third collector ballast resistor layer 523 at the interface between the third collector ballast resistor layer 523 and the second collector ballast resistor layer 522 is preferably the same as the molar ratio of AlAs of the second collector ballast resistor layer 522. Similarly, the molar ratio of AlAs of the first collector ballast resistor layer 521 at the interface between the first collector ballast resistor layer 521 and the second collector ballast resistor layer 522 is preferably the same as the molar ratio of AlAs of the second collector ballast resistor layer 522.

Next, another modification of the tenth embodiment will be described with reference to FIG. 28.

Figure 28:
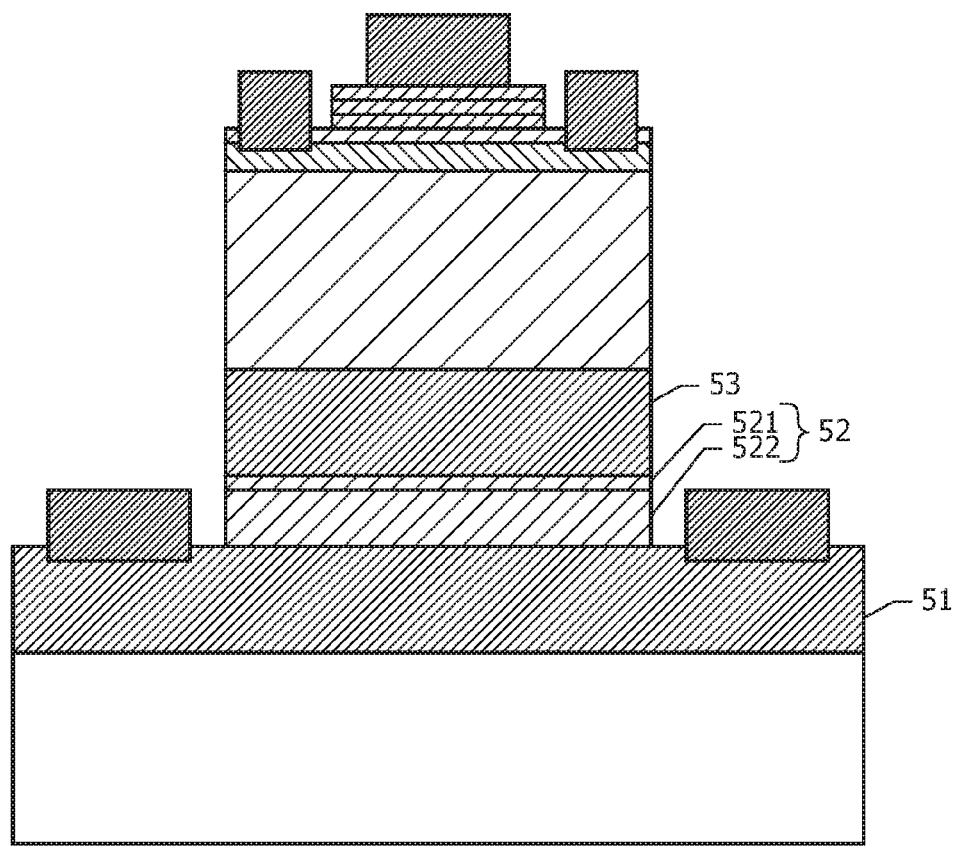
FIG. 28 is a sectional view of an HBT according to a modification of the tenth embodiment.

FIG. 28 is a sectional view of an HBT according to the modification of the tenth embodiment. In the tenth embodiment, the collector ballast resistor layer 52 includes three layers, namely, the first collector ballast resistor layer 521, the second collector ballast resistor layer 522 and the third collector ballast resistor layer 523. In contrast, in this modification, the third collector ballast resistor layer 523 (FIG. 27) is omitted, and a second collector ballast resistor layer 522 is in direct contact with a first sub-collector layer 51.

This modification has an advantageous effect in that discontinuity of the energy at the lower edge of the conduction band is not generated at the interface between the collector ballast resistor layer 52 and the second sub-collector layer 53 as in the tenth embodiment. Discontinuity of the energy at the lower edge of the conduction band is generated at the interface between the first sub-collector layer 51 and the collector ballast resistor layer 52. However, since the electron affinity of the second collector ballast resistor layer 522 is lower than the electron affinity of the first sub-collector layer 51, the potential barrier for an electron that moves from the collector ballast resistor layer 52 to the interface between the second collector ballast resistor layer 522 and the first sub-collector layer 51 toward the first sub-collector layer 51 is low. Therefore, in this modification, it is possible to obtain a sufficient effect of suppressing the occurrence of a potential barrier that is unnecessary for an electron.

Eleventh Embodiment

Next, a semiconductor device according to an eleventh embodiment will be described with reference to FIG. 29. Hereafter, descriptions of configurations that are common to those of the semiconductor device according to the fifth embodiment (FIGS. 10, 11, and 12) will be omitted.

Figure 29:
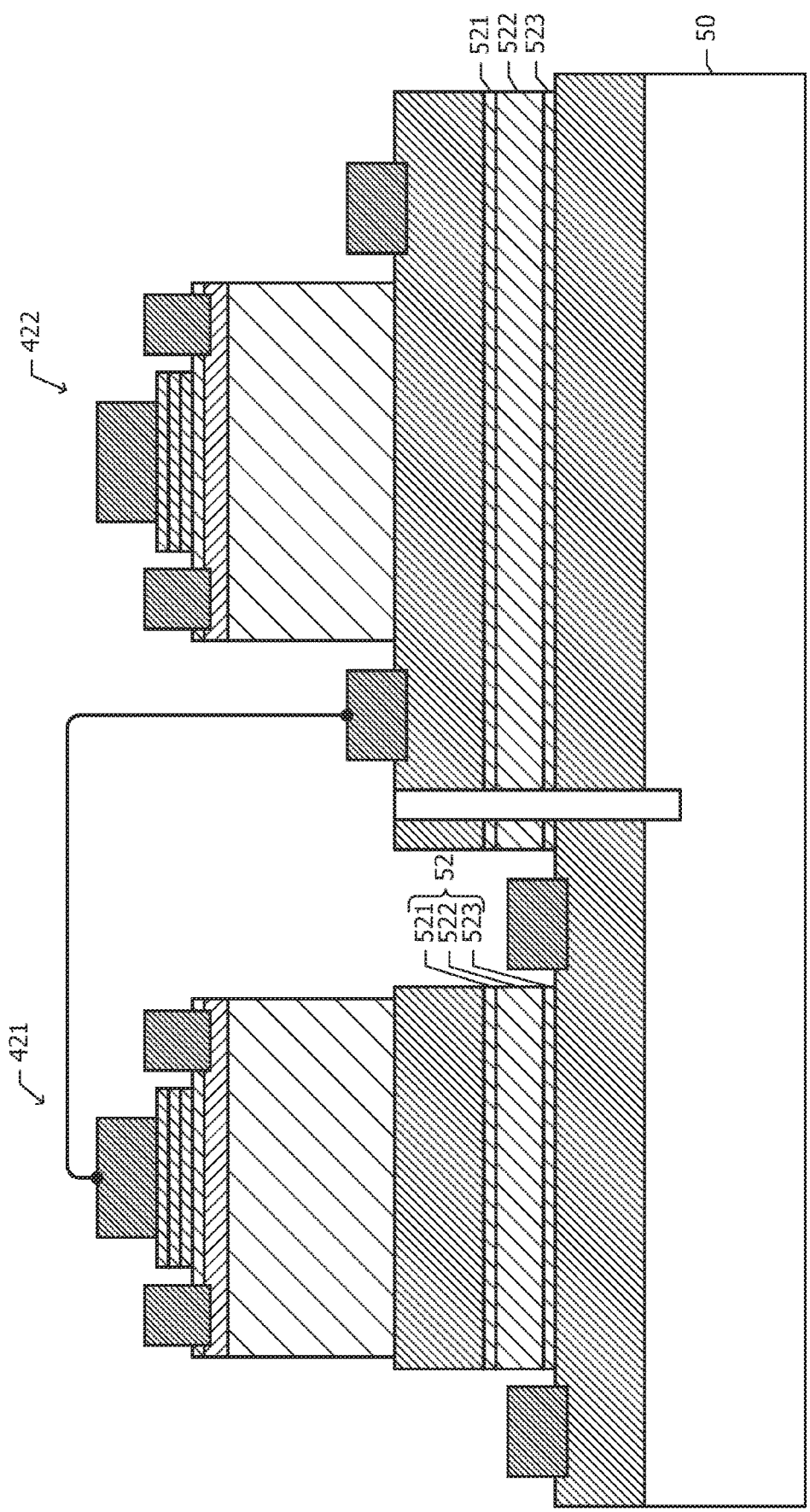
FIG. 29 is a sectional view of a semiconductor device according to an eleventh embodiment.

FIG. 29 is a sectional view of a semiconductor device according to the eleventh embodiment. A first HBT 421 and a second HBT 422 that are cascode-connected to each other are disposed on a substrate 50 as in the case of the fifth embodiment (FIG. 12). In the fifth embodiment, the collector ballast resistor layer 52 is made of n-type AlGaAs having a uniform composition. In contrast, in the eleventh embodiment, a collector ballast resistor layer 52 includes a first collector ballast resistor layer 521 whose composition is changed in the thickness direction, a second collector ballast resistor layer 522 having a uniform composition, and a third collector ballast resistor layer 523 whose composition is changed in the thickness direction as in the tenth embodiment (FIG. 27). The third collector ballast resistor layer 523 is disposed closest to the substrate 50 (on the lower side). The second collector ballast resistor layer 522 is disposed between the third collector ballast resistor layer 523 and the first collector ballast resistor layer 521.

The compositions, the doping concentrations, and the thicknesses of the first collector ballast resistor layer 521, the second collector ballast resistor layer 522, and the third collector ballast resistor layer 523 are respectively the same as the compositions, the doping concentrations, and the thicknesses of those of the tenth embodiment.

Next, an advantageous effect of the eleventh embodiment will be described. In the eleventh embodiment, the occurrence of a potential barrier that is unnecessary for an electron can be suppressed as in the tenth embodiment.

Next, a semiconductor device according to a modification of the eleventh embodiment will be described with reference to FIG. 30.

Figure 30:
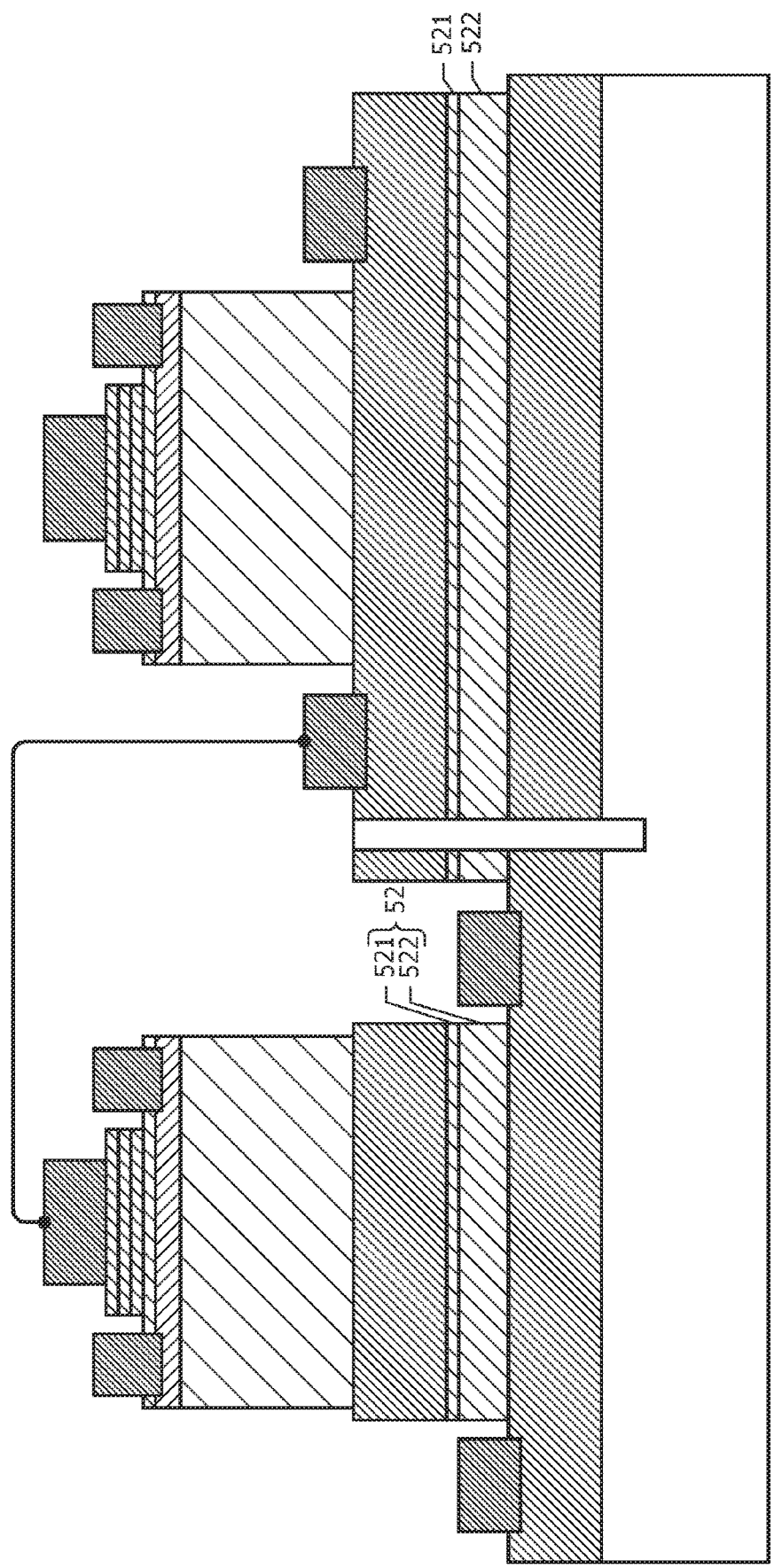
FIG. 30 is a sectional view of a semiconductor device according to a modification of the eleventh embodiment.

FIG. 30 is a sectional view of a semiconductor device according to the modification of the eleventh embodiment. In this modification, a collector ballast resistor layer 52 includes two layers, namely, a first collector ballast resistor layer 521 and a second collector ballast resistor layer 522 as in the modification of the tenth embodiment illustrated in FIG. 28. The third collector ballast resistor layer 523 (FIG. 29) of the eleventh embodiment is not provided.

In this modification, it is possible to obtain a sufficient effect of suppressing the occurrence of a potential barrier that is unnecessary for an electron as in the modification of the tenth embodiment illustrated in FIG. 28.

Twelfth Embodiment

Next, a radio-frequency power amplifier circuit according to a twelfth embodiment will be described with reference to FIG. 31. Hereafter, descriptions of configurations that are common to those of the radio-frequency power amplifier circuit according to the sixth embodiment (FIG. 13) will be omitted.

Figure 31:
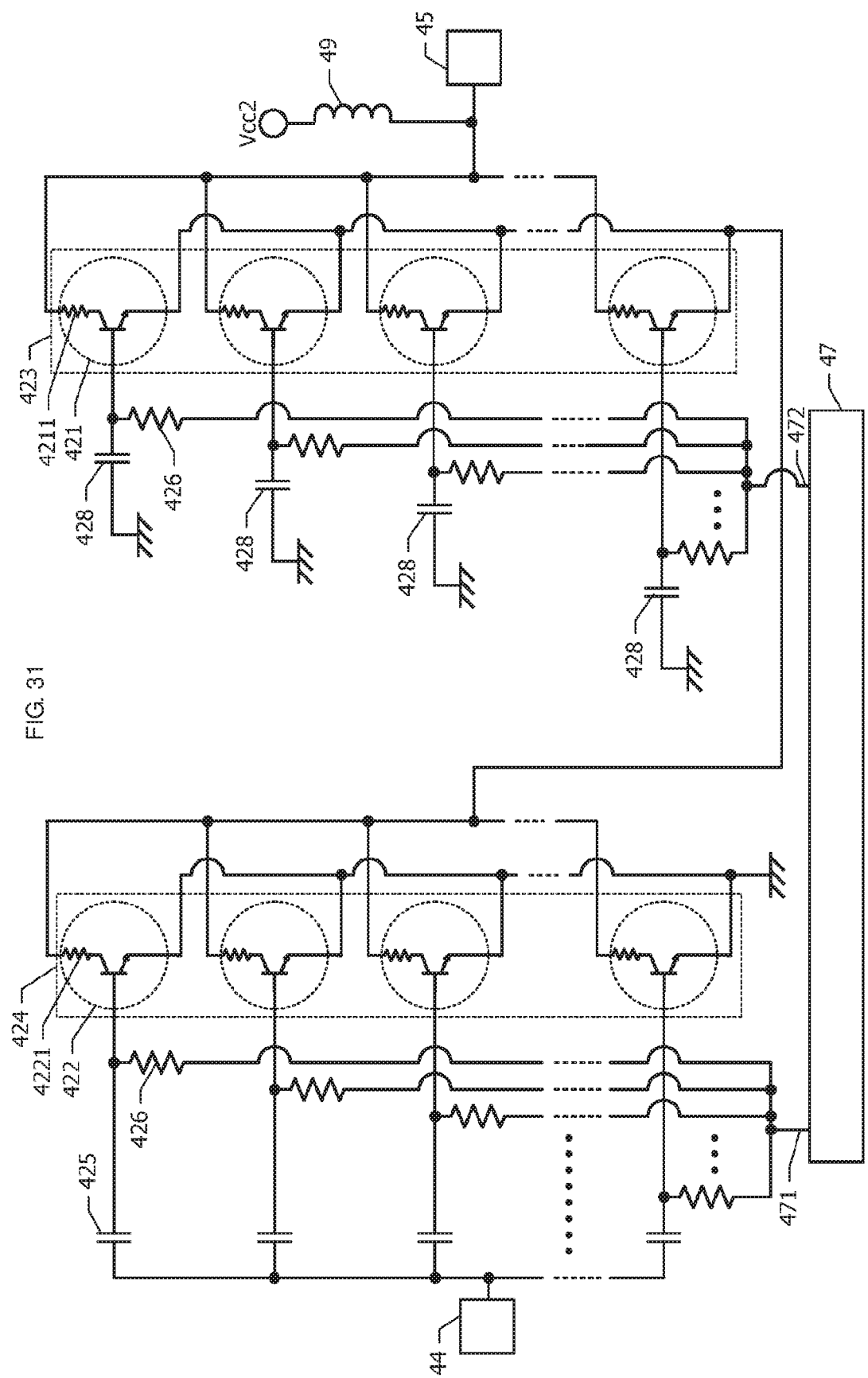
FIG. 31 is an equivalent circuit diagram of an output-stage amplifier circuit included in a radio-frequency power amplifier circuit according to a twelfth embodiment.

FIG. 31 is an equivalent circuit diagram of an output-stage amplifier circuit included in a radio-frequency power amplifier circuit according to the twelfth embodiment. In the sixth embodiment (FIG. 13), each of the bases of the first HBTs 421 is AC grounded via a grounding capacitor 427 with a low impedance. In the twelfth embodiment, bases of first HBTs 421 are each grounded via a corresponding base capacitor 428. The impedance when the ground side is viewed from the base of a first HBT 421 is substantially equal to the impedance when the input side of a radio-frequency signal is viewed from the base of a second HBT 422. In the sixth embodiment (FIG. 13), the second HBTs 422 include no collector ballast resistors. In the twelfth embodiment, the second HBTs 422 also include collector ballast resistors 4221.

In order to incorporate collector ballast resistors 4221 in the second HBTs 422, for example, in FIG. 12, the collector electrode 60 of the second HBT 422 is connected to the first sub-collector layer 51 as in the collector electrode 60 of the first HBT 421.

Next, advantageous effects of the twelfth embodiment will be described.

In the case where the impedance when the ground side is viewed from the base of the first HBT 421 is substantially equal to the impedance when the input side of a radio-frequency signal is viewed from the base of the second HBT 422, the first HBT 421 and the second HBT 422 perform substantially the same amplification operation. Therefore, the collector-emitter voltage of the first HBT 421 is substantially equal to the collector-emitter voltage of the second HBT 422. As a result, the output voltage can be increased by about twice compared with the output-stage amplifier circuit of the first embodiment (FIG. 2).

Since the first HBTs 421 and the second HBTs 422 include the collector ballast resistors 4211 and 4221, respectively, an increase in the chip size can be suppressed, and the occurrence of avalanche multiplication can be suppressed.

Thirteenth Embodiment

Next, a radio-frequency power amplifier circuit according to a thirteenth embodiment will be described with reference to FIG. 32. Hereafter, descriptions of configurations that are common to those of the radio-frequency power amplifier circuit according to the eighth embodiment (FIG. 16) will be omitted.

Figure 32:
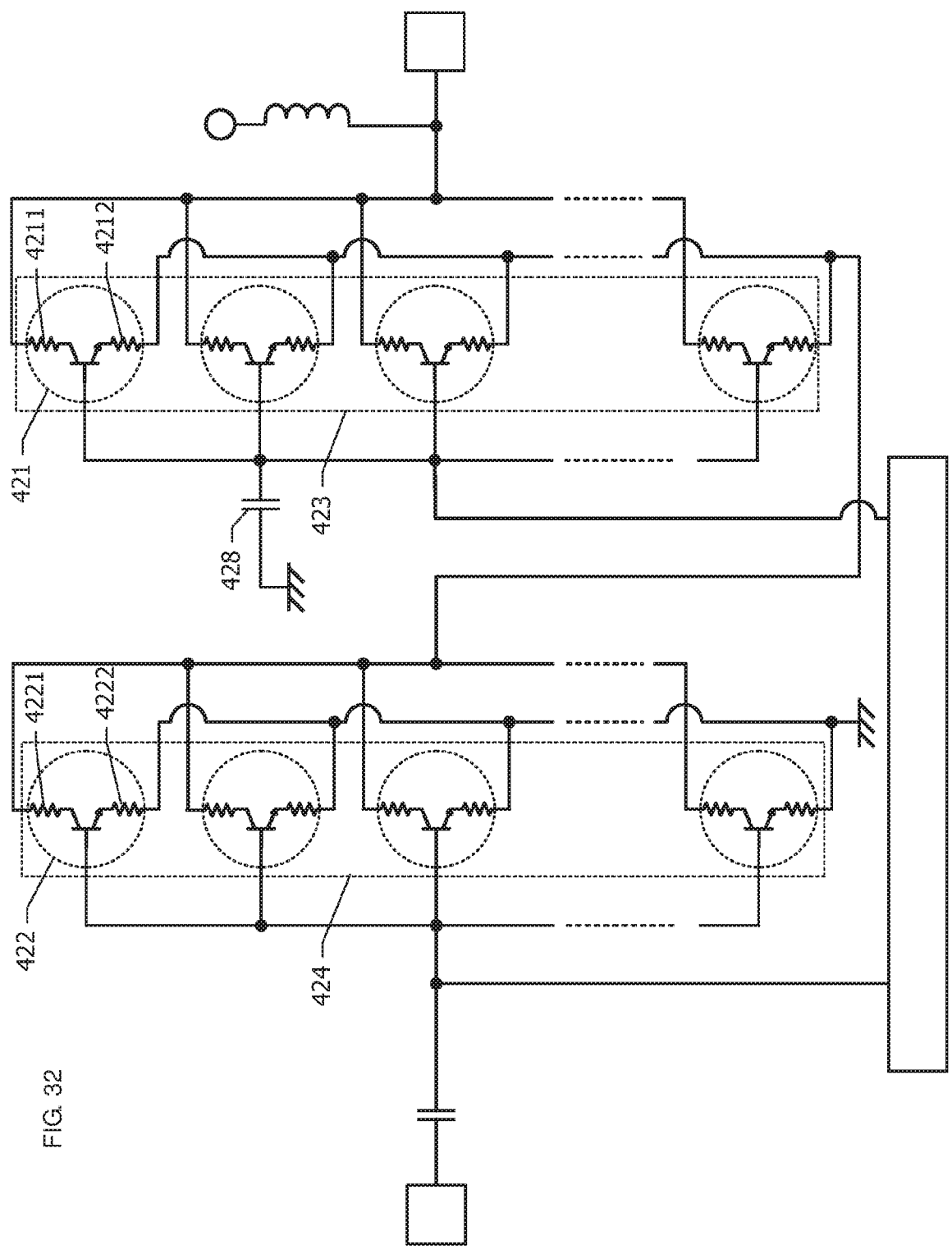
FIG. 32 is an equivalent circuit diagram of an output-stage amplifier circuit included in a radio-frequency power amplifier circuit according to a thirteenth embodiment.

FIG. 32 is an equivalent circuit diagram of an output-stage amplifier circuit included in a radio-frequency power amplifier circuit according to the thirteenth embodiment. In the eighth embodiment (FIG. 16), the bases of the first HBTs 421 are AC grounded via a single grounding capacitor 427 with a low impedance. In the thirteenth embodiment, bases of first HBTs 421 are each grounded via a single base capacitor 428. The impedance when the ground side is viewed from the base of a first HBT 421 is substantially equal to the impedance when the input side of a radio-frequency signal is viewed from the base of a second HBT 422, as in the case of the twelfth embodiment. In the eighth embodiment (FIG. 16), the second HBTs 422 include no collector ballast resistors. In the thirteenth embodiment, the second HBTs 422 also include collector ballast resistors 4221.

Next, advantageous effects of the thirteenth embodiment will be described. In the thirteenth embodiment, the output voltage can be increased as in the twelfth embodiment. Furthermore, since the first HBTs 421 and the second HBT 422s include the collector ballast resistors 4211 and 4221, respectively, an increase in the chip size can be suppressed, and the occurrence of avalanche multiplication can be suppressed.

The embodiments and modifications described above are exemplary, and, needless to say, a partial replacement or combination of configurations described in different embodiments and modifications is possible. The same or similar operations and effects achieved by the same or similar configurations in a plurality of embodiments and modifications will not be mentioned in each of the embodiments and modifications. Furthermore, the present disclosure is not limited to the embodiments and modifications described above. For example, it is obvious for those skilled in the art that various changes, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A heterojunction bipolar transistor comprising:
   a collector layer;
   a base layer;
   an emitter layer;
   a first sub-collector layer functioning as an inflow path of a collector current that flows in the collector layer; and
   a collector ballast resistor layer disposed between the collector layer and the first sub-collector layer and having a lower doping concentration than the first sub-collector layer, wherein
   the collector ballast resistor layer includes a semiconductor layer containing AlGaAs or GaAs as a main component,
   the collector layer is formed of GaAs,
   the collector ballast resistor layer includes a first collector ballast resistor layer and a second collector ballast resistor layer that is disposed between the first collector ballast resistor layer and the first sub-collector layer,
   the second collector ballast resistor layer is formed of AlGaAs, and
   a composition of the first collector ballast resistor layer is changed from AlGaAs to GaAs in a direction from the second collector ballast resistor layer toward the collector layer.

2. The heterojunction bipolar transistor according to claim 1, further comprising:
   a second sub-collector layer disposed between the collector ballast resistor layer and the collector layer and having a higher doping concentration than each of the collector layer and the collector ballast resistor layer.

3. The heterojunction bipolar transistor according to claim 2, further comprising:
   an emitter ballast resistor layer that is disposed on a side opposite to the base layer as viewed from the emitter layer and that includes a semiconductor layer containing AlGaAs as a main component.

4. The heterojunction bipolar transistor according to claim 2, wherein
   the first sub-collector layer, the collector layer, and the base layer are each formed of a semiconductor containing GaAs as a main component, and
   the emitter layer is formed of a semiconductor containing InGaP as a main component.

5. The heterojunction bipolar transistor according to claim 1, further comprising:
   an emitter ballast resistor layer that is disposed on a side opposite to the base layer as viewed from the emitter layer and that includes a semiconductor layer containing AlGaAs as a main component.

6. The heterojunction bipolar transistor according to claim 1, wherein
   the first sub-collector layer, the collector layer, and the base layer are each formed of a semiconductor containing GaAs as a main component, and
   the emitter layer is formed of a semiconductor containing InGaP as a main component.

* * * * *